(12) United States Patent
Kang

(10) Patent No.: US 7,379,357 B2
(45) Date of Patent: May 27, 2008

(54) SEMICONDUCTOR MEMORY DEVICE HAVING ADVANCED REPAIR CIRCUIT

(75) Inventor: Sang-Hee Kang, Ichon-shi (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 0 days.

(21) Appl. No.: 10/749,836

(22) Filed: Dec. 30, 2003

(65) Prior Publication Data

US 2004/0218433 A1 Nov. 4, 2004

(30) Foreign Application Priority Data

Apr. 30, 2003 (KR) .................. 10-2003-0027762

(51) Int. Cl.
*G11C 7/00* (2006.01)
(52) U.S. Cl. .................. 365/200; 365/194; 365/230.01
(58) Field of Classification Search ................ 365/200, 365/225.7, 189.07, 230.03, 194, 230.01
See application file for complete search history.

(56) References Cited

U.S. PATENT DOCUMENTS

| | | | |
|---|---|---|---|
| 5,424,672 A | 6/1995 | Cowles et al. | |
| 5,508,638 A | 4/1996 | Cowles et al. | |
| 5,663,658 A | 9/1997 | Cowles et al. | |
| 6,087,889 A | 7/2000 | Mok | |
| 6,118,712 A * | 9/2000 | Park et al. | 365/200 |
| 6,223,248 B1 * | 4/2001 | Bosshart | 711/105 |
| 6,449,197 B1 * | 9/2002 | Hiraki et al. | 365/189.05 |
| 6,496,431 B1 * | 12/2002 | Nakahara et al. | 365/200 |
| 6,538,934 B2 | 3/2003 | Sakata | |
| 6,570,806 B2 | 5/2003 | Bertin et al. | |
| 6,668,344 B1 * | 12/2003 | Sakata et al. | 365/201 |
| 2002/0196693 A1 | 12/2002 | Bertin et al. | |
| 2003/0107928 A1 * | 6/2003 | Sakata | 365/200 |
| 2004/0078701 A1 * | 4/2004 | Miyanishi | 714/42 |

FOREIGN PATENT DOCUMENTS

| | | |
|---|---|---|
| JP | 07-176696 | 7/1995 |
| JP | 09-198897 | 7/1997 |

* cited by examiner

*Primary Examiner*—Thong Q. Le
(74) *Attorney, Agent, or Firm*—Blakely, Sokoloff, Taylor & Zafman LLP

(57) ABSTRACT

A semiconductor device for comparing an input address with a repair address includes a signal controller for generating control signals. An address latch unit in response to the control signals latches the address. Each of N number of M-bit address comparators compares the address with the stored repair address. A comparator delay modeling block delays the control signal for a predetermined time, i.e., delay value of the M-bit address comparator. A repair circuit controller in response to the delayed control signal output from the comparator delay modeling block generates one of a repair address enable signal and a normal address enable signal based on a comparison result of the M-bit address comparator.

25 Claims, 16 Drawing Sheets

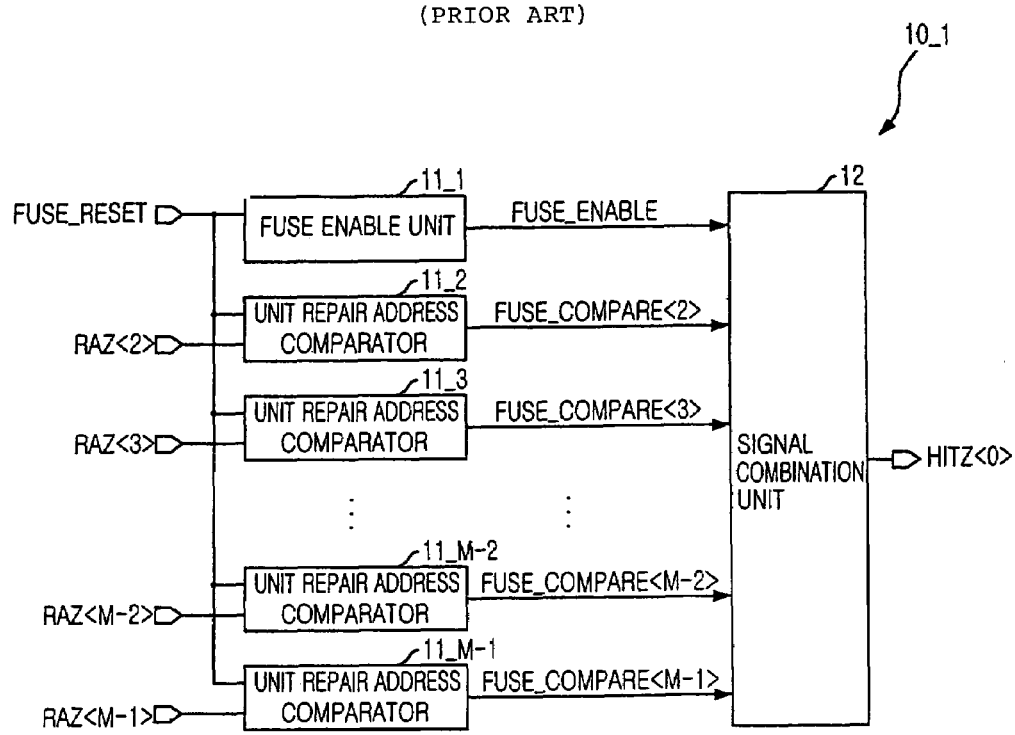
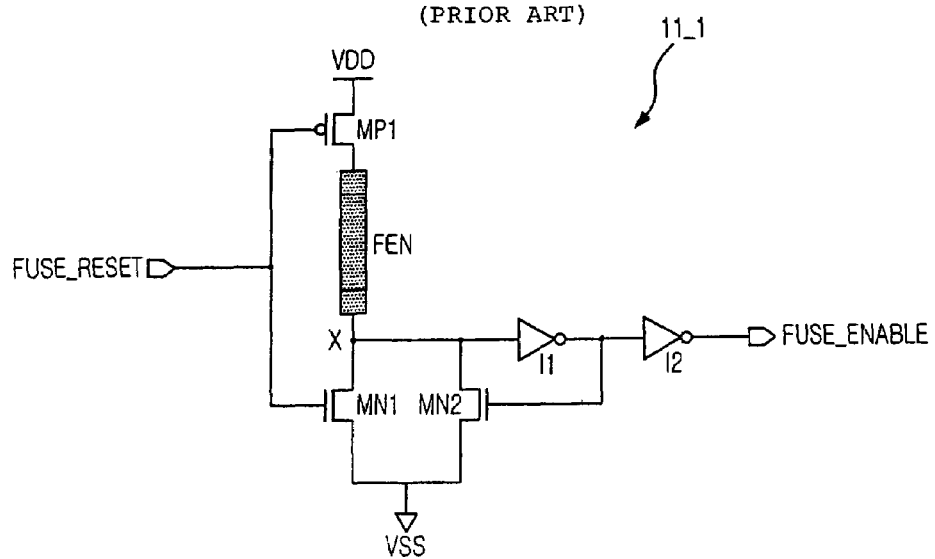

SEMICONDUCTOR MEMORY DEVICE HAVING ADVANCED REPAIR CIRCUIT

FIELD OF INVENTION

The present invention relates to a semiconductor memory device; and, more particularly, to a repair circuit of the semiconductor memory device for substituting spare memory cells for defective memory cells.

DESCRIPTION OF PRIOR ART

Generally, if there is at least one faulty cell in a plurality of cells of a semiconductor memory device, the semiconductor memory device may not be used. A fractional yield of manufacturing process is not improved if a memory device is treated as an inferior but acceptable device whenever there is a minor fault in a part of a circuit of the memory device.

In order to improve the fractional yield, a repair circuit in the memory device substitutes spare memory cells for defective memory cells having a minor fault. Namely, the repair circuit performs a repair operation that a spare unit cell array accessed by spare row and column address lines is substituted for a faulty unit cell array having at least one faulty unit cell. Generally, in the memory device, the repair circuit and a plurality of spare unit cells for the repair operation is called as a redundancy circuit.

In detail, after the memory device is fabricated in a semiconductor wafer, a plurality of unit cells in the memory device are examined by a test circuit. If there is any faulty cell in the memory device, an address corresponding to the faulty unit cell array is changed to match the spare unit cell array. As a result, if the address corresponding to the faulty unit cell array is input, a predetermined spare unit cell array is selected instead of the faulty unit cell array.

FIG. 1 is a block diagram showing a repair circuit of the conventional semiconductor memory device.

As shown, the repair circuit of the conventional semiconductor memory device includes an address latch unit 40, a plurality of unit repair address comparators 10_1 to 10_N, a fuse initialization circuit 20 and a repair circuit controller 60.

The address latch unit 40 latches buffering addresses EAT<0:M−1>. The plurality of unit repair address comparators 10_1 to 10_n individually compares repair addresses with addresses RAZ<2:M−1> output from the address latch unit 40. The fuse initialization circuit 20 is used for initializing the plurality of unit repair address comparators 10_1 to 10_N. The repair circuit controller 60 determines whether original cell array or spare cell array is accessed by repair control signals HITZ<0:N−1> from the plurality of unit repair address comparators 10_1 to 10_N.

The repair circuit further includes a predecoder 30 and a bank controller 50. Herein, the predecoder 30 predecodes latched data and then outputs the predecoded data to a main decoder of the memory device not shown in the figure. The bank controller 50 outputs control signals AE, AED1, AED2 and RAE for controlling the address latch unit 40 of the bank of the memory device.

FIG. 2 is a block diagram showing the unit repair address comparator, e.g., 10_1, shown in FIG. 1.

As shown, the unit repair address comparator 10_1 includes a fuse enable unit 11_1, a plurality of repair address comparators 11_2 to 11_M−1 and a signal combination unit 12. The fuse enable unit 11_1 receives a fuse reset signal FUSE_RESET output from the fuse initialization circuit 20 shown in FIG. 1 and outputs a fuse enable signal FUSE_ENABLE for enabling the signal combination unit 12. A plurality of the repair address comparators 11_2 to 11_M−1 compare each one bit address, e.g., RAZ<2>, output from the address latch unit 40 with each one bit repair address respectively. The signal combination unit 12 determines whether the input address of the unit repair address comparator 10_1, RAZ<2:M−1>, is the repair address or not, by using combination result of a plurality of address compare signals FUSE_COMPARE<2:M−1>.

FIG. 3 is a schematic circuit diagram describing the fuse enable unit 11_1 shown in FIG. 2.

As shown, the fuse enable unit 11_1 includes an enable fuse FEN, a first MOS transistor MP1, a second MOS transistor MN1, a third MOS transistor MN2, a first inverter I1 and a second inverter I2. The enable fuse FEN is coupled to the first and second MOS transistors MP1 and MN1. The first MOS transistor MP1 is connected to a supply voltage VDD. The second MOS transistor MN1 is connected to a ground voltage VSS. Gates of the first MOS transistor MP1 and the second MOS transistor MN1 are supplied with the fuse reset signal FUSE_RESET. The first inverter I1 receives a supplied signal of a node X between the enable fuse and the second MOS transistor MN1 and outputs the inverse signal to the second inverter I2. The gate of the third MOS transistor MN2 is coupled to an output terminal of the first inverter I1. The drain and source of the third MOS transistor MN2 are coupled to the node X and the ground voltage VSS. The second inverter I2 inverts the output signal from the first inverter I1 and outputs the fuse enable signal FUSE_ENABLE.

FIG. 4 is a schematic circuit diagram depicting one of a plurality of the repair address comparators shown in FIG. 2.

As shown, the repair address comparator 11_2 includes an address fuse F, a fourth MOS transistor MP2, a fifth MOS transistor MN2, a sixth MOS transistor MN4, a third inverter I3, a fourth inverter I4, a fifth inverter I5, a first pass gate T1 and a second pass gate T2.

The address fuse F is coupled to the fourth and fifth MOS transistors MP2 and MN3. The fourth MOS transistor MP2 is coupled to the supply voltage VDD. The fifth MOS transistor MN3 is coupled to the ground voltage VSS. Gates of the fourth MOS transistor MP2 and the fifth MOS transistor MN3 are supplied with the fuse reset signal FUSE_RESET. The third inverter I3 receives an input signal from a node Y between the address fuse and the fifth MOS transistor MN3 and outputs the inverse signal to the fourth inverter I4. The gate of the sixth MOS transistor MN4 is coupled to an output terminal of the third inverter I3. The drain and source of the third MOS transistor MN2 are coupled to the node Y and the ground voltage VSS. The fourth inverter I4 inverts the output signal from the third inverter I3. The output signals from the third inverter I3 and the fourth inverter I4 control the first and the second pass gates T1 and T2. The first pass gate T1 is turned on for transmitting the input address RAZ<2> as the address compare signal FUSE_COMPARE<2> if the address fuse F blows out. The second pass gate T2 is turned on for transmitting the inverse address /RAZ<2> which is inverted by the fifth inverter I5 as the address compare signal FUSE_COMPARE<2> if the address fuse F does not blow out.

FIG. 5 is a schematic circuit diagram describing the signal combination unit 12 shown in FIG. 2.

As shown, the signal combination unit 12 includes four three-input NOR gates, one two-input NOR gate, two two-input NAND gates and one inverter. The first NOR gate NOR1 receives the fuse enable signal, FUSE_ENABLE, and two address compare signals, FUSE_COMPARE<2> and FUSE_COMPARE<3>. The second NOR gate NOR2 receives three address compare signals, FUSE_COMPARE<4> to FUSE_COMPARE<6>. The third NOR gate NOR3 receives three address compare signals, FUSE_COMPARE<7> to FUSE_COMPARE<9>. The fourth NOR gate NOR4 receives three address compare signals, FUSE_COMPARE<10> to FUSE_COMPARE<12>. The first NAND gate ND1 receives output signals from the first and the second NOR gates NOR1 and NOR2. The second NAND gate ND2 receives output signals from the third and the fourth NOR gates NOR3 and NOR4. The fifth NOR gate NOR5 which is a two-input NOR gate receives output signals from the first and the second NAND gates ND1 and ND2. The sixth inverter I6 outputs the inverse output signal from the fifth NOR gate as the repair control signal HITZ<0>.

FIG. 6 is a schematic circuit diagram showing a first example of a partial circuit in the address latch unit 40. The first exemplary partial circuit outputs one bit, e.g., EAT<0>, of the buffering addresses EAT<0:M−1> to the predecoder 30 or the unit repair address comparators 10_1 to 10_N in response to first and second control signals AE and RAE which are output from the bank controller 50.

As shown, the first exemplary partial circuit of the address latch unit 40 includes a third pass gate T3, four inverters and two NAND gates. The third pass gate T3 transmits one bit buffering address EAT<1> if the third pass gate T3 is turned on by the control signal AE. The eighth inverter I8 and the eleventh inverter I11 which are loop-connected are used for latching the transmitted signal from the third pass gate T3. The eleventh inverter I11 is controlled by the first control signal AE. The third NAND gate ND3 receives the first control signal AE and the inverse transmitted signal which is output from the eighth inverter I8. The fourth NAND gate ND4 receives the control signal RAE and the inverse transmitted signal which is output from the eighth inverter I8. The ninth inverter I9 and the tenth inverter I10 respectively invert output signals from the third NAND gate ND3 and the fourth NAND gate ND4 and respectively output inverse signals to the predecoder 30 and the unit repair address comparator as BAZ<1> and RAZ<1>.

FIG. 7 is schematic circuit diagram depicting another example of a partial circuit in the address latch unit 40. The second exemplary partial circuit outputs one bit, e.g., EAT<0>, of the buffering addresses EAT<0:M−1> to the predecoder 30 in response to the control signals, e.g., AE which is output from the bank controller 50.

As shown, the second exemplary partial circuit includes a fourth pass gate T4 and six inverters I12 to I17. The fourth pass gate T4 transmits one bit buffering address EAT<1> if the fourth pass gate T4 is turned on by the control signal AE. The fourteenth inverter I14 and the fifteenth inverter I15 which are loop-connected are used for latching the transmitted signal from the fourth pass gate T4. The other inverters I16 and I17 are serially connected and output the transmitted signal to the predecoder 30 as BAZ<1>.

FIG. 8 is a schematic circuit diagram describing the repair circuit controller 60. Herein, there is an exemplary circuit of the repair circuit controller 60 if a number of the unit repair address comparators are 32.

As shown, the repair circuit controller 60 includes eight four-input NAND gates ND3 to ND10, two two-input NAND gates ND11 and ND12, six NOR gates NOR6 to NOR11 and four inverters I18 to I21.

Each NAND gate, ND3 to ND10, receives four repair signals output from four unit repair address comparators. For instance, third NAND gate ND3 receives four repair signals HITZ<0:3> output from four unit repair address comparators 10_1 to 10_4; and fourth NAND gate ND4 receives another four repair signals HITZ<4:7> output from another four unit repair address comparators 10_5 to 10_8. This rule applies to another six four-input NAND gates ND5 to ND10.

Four NOR gates NOR6 to NOR9 respectively receive two output signals from two NAND gates. For example, the sixth NOR gate NOR6 receives two output signal from the two NAND gates ND3 and ND4; and the seventh NOR gate NOR7 receives two output signal from another two NAND gates ND5 and ND6. This rule applies to another two NOR gates NOR8 and NOR9. Then, each of two NAND gates ND11 and ND12 receives each two output signals from each two NOR gates; NOR6 and NOR7, NOR8 and NOR9. As a result, the NAND gate ND11 outputs HIT_SUM_UP which means a summation result of the first half, e.g., HITZ<0:15>, in total repair signals, e.g., HITZ<0:31>. Likewise, the NAND gate ND12 outputs HIT_SUM_DOWN which means a summation result of the second half, e.g., HITZ<16:31>, in total repair signals, e.g., HITZ<0:31>.

The NOR gate NOR10 receives the two output signals HIT_SUM_UP and HIT_SUM_DOWN from the two NAND gates ND11 and ND12. Meanwhile, the NOR gate NOR11 receives the two output signals HIT_SUM_UP and HIT_SUM_DOWN from the two NAND gates ND11 and ND12; and an inverse delayed control signal /AED2 which is output from the bank controller 50. Then, the inverter I19 outputs the inverse output signal from the NOR gate NOR10 as a redundancy circuit enabling signal RED_ENABLE. Also, the inverters I20 and I21 outputs the output signal from the NOR gate NOR11 as a normal circuit enabling signal NORMAL_ENABLE.

FIG. 9 is a block diagram showing a partial block of the bank controller 50 shown in FIG. 1. The bank controller 50 further includes a delay unit for delaying the first control signal AE by a predetermined time and outputting delayed control signals AED1 and AED2.

FIG. 10 is a waveform demonstrating the repair operation of the memory device shown in FIG. 1. Hereinafter, referring to FIG. 1 to 10, the repair operation of the memory device in accordance with the prior art is described in detail.

The memory device includes a plurality of the banks. Furthermore, each bank includes the redundancy circuit having the repair circuit and the plurality of spare unit cells. Namely, each bank of the memory device has the repair circuit shown in FIG. 1.

Meanwhile, in the repair operation that a spare unit cell is substituted for a faulty unit cell, one unit repair address comparator is used for substituting one address path of the spare unit cell for that of the faulty unit cell.

In order to substitute one address path, one of the unit repair address comparators, e.g., 10_1, is selected, and then, the enable fuse FEN included in the fuse enable unit, e.g., 11_1, is blown out by a laser. The address fuses of the unit address comparators in response to addresses which must to be repaired is selectively blown out. As a result, one unit repair address comparator stores one repaired address which may access the spare unit cell. If a number of the repair address comparators, as shown in FIG. 8, are 32, the redundancy circuit may repair total 32 address paths.

In read or write operation of the memory device, if an address signal for accessing unit cell is input in the memory device, the address latch unit 40 latches the address signal which is input throughout an address input buffer, not shown. The address latch unit 40 receives the address EAT<0:M−1> and outputs the normal address BAZ<0:M−

1> to the predecoder 30 in response to the first control signal AE which is output from the bank controller 50.

The predecoder 30 decodes the normal address BAZ<0:M−1> and outputs the decoded normal address ADD<0:M−1> to the main decoder, not shown. The main decoder finally decodes the decoded normal address ADD<0:M−1>. The decoded address from the main decoder is used for selecting any accessed unit cell.

Meanwhile, the address latch unit 40 receives the buffering address EAT<0:M−1> and outputs the address RAZ<2:M−1> to the plurality of unit repair address comparators 10_1 to 10_n in response to the control signal RAE which is output to the bank controller 50. Herein, the buffering address EAT<0:M−1> has two bits more than the address RAZ<2:M−1> does, because one repair address may be substituted for four redundancy word line in a typical memory device.

The plurality of unit repair address comparators 10_1 to 10_N respectively receives the input address RAZ<2:M−1> and outputs the repair signal, e.g., HITZ<0>, if the input address RAZ<2:M−1> is the repair address. Thus, if a number of the unit repair address comparators are 32, the repair circuit may substitute 32 repair addresses for total 32 original addresses which access the faulty unit cells.

Herein, how the repair signal, e.g., HITZ<0> is output from the unit repair address comparator is described in detail.

First, the enable fuse FEN in the fuse enable unit 11_1 is blown out by irradiating the laser. The fuse reset signal FUSE_RESET, as pulse having low-high-low state at initial operation of the memory device, is output to the fuse enable unit 11_1 and the plurality of repair address comparators 11_2 to 11_M−1. If the enable fuse FEN in the fuse enable unit 11_1 is blown out, the signal combination unit 12 is enabled by the fuse enable signal FUSE_ENABLE which is activated at logical low.

If the address fuse F included in the repair address comparator 11_2 is blown out, the repair address comparator 11_2 receives one bit address signal RAZ<2> of the address signal which is output from the address latch unit 40 and outputs the address signal RAZ<2> as the address compare signal FUSE_COMPARE<2>. Otherwise, if the address fuse F is not blown out, the repair address comparator 11_2 receives one bit address signal RAZ<2> of the address signal which is output from the address latch unit 40 and outputs the inverse address signal /RAZ<2> as the address compare signal FUSE_COMPARE<2>.

The signal combination unit 12 serves as combining two signals which are output from the fuse enable unit 11_1 and the repair address comparator 11_2 to 11_M. If the two signals output from the fuse enable unit 11_1 and the repair address comparator 11_2 to 11_M are at logical low, the repair signal HIZ<0> activated at logical low is output. There is the signal combination unit as shown in FIG. 5 in case when a number of the repair address is 11.

Thus, as the address fuses F included in the plurality of repair address comparators 11_2 to 11_M−1 are selectively blown out, the repair address comparators may respectively compare each of the input addresses RAZ<2:M−1> with each of the repair addresses stored in each of unit repair address comparators 10_1 to 10_N. The repair address comparators 10_1 to 10_N respectively output the repair signals HITZ<0:n> activated at logical low in response to each of above comparison results.

In the repair circuit controller 60, if at least one of the repair signals HITZ<0:N> is at logical low, i.e., at least one of the NAND gates ND3 to ND10 receives the low-level repair signal, an output signal of the NAND gate which receives the low-level repair signal is at logical high. As a result, the first or the second output signal HIT_SUM_UP or HIT_SUM_DOWN from the NAND gate ND11 or ND12 is enabled at logical high. Then, the redundancy circuit enable signal RED_ENABLE is enabled at logical high, and the normal circuit enable signal NORMAL_ENABLE is disabled at logical low.

If the redundancy circuit enable signal RED_ENABLE is enabled at logical high, the data access operation is performed by using the spare unit cells used for substituting for the faulty unit cells of the memory device because the latched addresses RAS<2:M−1> in the repair circuit are the repair addresses.

Meanwhile, in case any bit of the stored repair address is not identical to any bit of the latched address RAS<2:M−1> in the plurality of repair address comparators 10_1 to 10_N, all the repair signals HITZ<0:N> are output as logical high. As a result, the first or the second output signal HIT_SUM_UP or HIT_SUM_DOWN from the NAND gate ND11 or ND12 is enabled at logical low. Then, the redundancy circuit enable signal RED_ENABLE is disabled at logical low, and the normal circuit enable signal NORMAL_ENABLE is enabled at logical high.

If the redundancy circuit enable signal RED_ENABLE is disabled at logical low, the data access operation is performed by using the normal unit cells of the memory device because the latched addresses RAS<2:M−1> in the repair circuit are not the repair addresses.

Herein, the control signal AED2 of the repair circuit controller 60 is generated by delaying the first control signal AE for a predetermined time. The controls signal AED2 is used for outputting the normal circuit enable signal NORMAL_ENABLE. Namely, when the control signal AED2 is input at logical high to the repair circuit controller 60, the normal circuit enable signal NORMAL_ENABLE is output in response to changing logical levels of the first and the second output signals HIT_SUM_UP and HIT_SUM_DOWN from the NAND gates ND11 and ND12.

FIG. 11 is a waveform showing operation problem of the memory device shown in FIG. 1. Hereinafter, referring to FIG. 1 to 11, the operation problem of the memory device in accordance with the prior art is described in detail.

A problem with the repair operation of the repair circuit in the memory device is that the fuse enable signal FUSE_ENABLE is not controlled. In detail, if the fuse initialization circuit 20 outputs the fuse reset signal FUSE_RESET to the unit repair address comparators 10_1 to 10_N, the fuse enable unit included in each unit repair address comparator generates the fuse enable signal FUSE_ENABLE. Then, the signal combination unit 12 outputs the repair signal, e.g., HITZ<0>, to the repair circuit controller 60 in response to the fuse enable signal FUSE_ENABLE. As a result, the repair circuit controller 60 outputs the redundancy enable signal RED_ENABLE and the normal circuit enable signal NORMAL_ENABLE.

The fuse reset signal FUSE_RESET is automatically generated if the memory device begins to operate, and the fuse enable signal FUSE_ENABLE is immediately generated by the fuse reset signal FUSE_RESET. So, only the fuse enable signal FUSE_ENABLE cannot control and adjust a point of time when the redundancy enable signal RED_ENABLE and the normal circuit enable signal NORMAL_ENABLE is output.

Meanwhile, when one unit repair address comparator, e.g., 10_1, is used for repairing the specific address, the the enable fuse FEN of the fuse enable comparator 11_1 is blown out without blowing out the enable fuses FEN of all repair address comparators 11_1 to 11_M−1, i.e., all address bits which are repaired are 1.

Namely, in a precharge state, e.g., PCG section shown in FIG. 10, all address comparison signals FUSE_COMPARE<2:12> and the fuse enable signal FUSE_ENABLE are at logical low when all input address bits of the repair address comparators 11_1 to 11_M−1 are 1. As a result, the repair signal HITZ<0> is enabled as logical low level.

If the repair signal HITZ<0> is enabled as logical low level in the precharge state, the first and the second output signals HIT_SUM_UP and HIT_SUM_DOWN from the NAND gates ND11 and ND12 become logical high. However, in this case when the first and the second output signals HIT_SUM_UP and HIT_SUM_DOWN from the NAND gates ND11 and ND12 are logical high in the precharge state, e.g., PCG section, if the following input address of the signal comparison unit 12 is not the repair address, the first and the second output signals HIT_SUM_UP and HIT_SUM_DOWN from the NAND gates ND11 and ND12 are restored, i.e., become logical low.

Typically, the repair circuit controller 60 may be operated on high speed in response to a point of time when the repair signal changes a logical high level into a logical low level. As a result, the first or the second output signal HIT_SUM_UP or HIT_SUM_DOWN from the NAND gate ND11 or ND12 may rapidly change the logical low level into the logical high level; otherwise, it takes more time for the first and the second output signals HIT_SUM_UP and HIT_SUM_DOWN from the NAND gates ND11 and ND12 to change the logical high level into the logical low level.

The control signal AED2 which is output from the bank controller 60 is used for adjusting a point of time when the redundancy circuit enable signal RED_ENABLE and the normal circuit enable signal NORMAL_ENABLE are output from the repair circuit controller 60. Referring to FIG. 11, time margin needed for outputting the control signal AED2 is varied in response to each of two cases when the first or the second output signal HIT_SUM_UP or HIT_SUM_DOWN from the NAND gate ND11 or ND12 changes the logical low level into the logical high level and changes the logical high level into the logical low level.

When the first or the second output signal HIT_SUM_UP or HIT_SUM_DOWN from the NAND gate ND11 or ND12 changes the logical high level into the logical low level, critical error that the redundancy circuit enable signal RED_ENABLE and the normal circuit enable signal NORMAL_ENABLE are not output at a preferred point of time result because the margin of the control signal AED2 is too small.

As above statement, because the fuse enable signal FUSE_ENABLE is not controlled, the repair signal HITZ is output to the repair circuit controller 60 if the address RAZ<2:M−1> is input to the repair address comparator 11_1 to 11_M−1. Also, the bank controller 60 outputs the control signal AED2 by delaying the first control signal AE for a predetermined time without any other condition. As a result, there is a large time gap between when the first or the second output signal HIT_SUM_UP or HIT_SUM_DOWN from the NAND gate ND11 or ND12 changes the logical low level or the logical high level into the logical low level or the logical high level and when the control signal AED2 is input. Thus, in order to support operation of the memory device without any error, loss of operation time is unavoidable to provide additional margin. Namely, referring to 'A' and 'B' sections shown in FIG. 11, operation speed of the memory device slows down.

If an address is input to the memory device, the memory device determines whether the input address is the repair address or not. As a result, the normal unit cell or the spare unit cell is accessed. Because this operation cannot be omitted in operation of the memory device, the margin of the repair circuit controller 60 is very critical in the operation of the memory device.

Thus, as above statement, if the time gap between when the first or the second output signal HIT_SUM_UP or HIT_SUM_DOWN from the NAND gate ND11 or ND12 changes the logical low level or the logical high level into the logical low level or the logical high level and when the control signal AED2 is input is unstable, reliability of the operation of the memory device is dramatically decreased. In addition, loss of operation time is unavoidable for confirming additional margin in order to supporting the reliability of the operation of memory device.

SUMMARY OF INVENTION

It is, therefore, an object of the present invention to provide a semiconductor memory device having an advanced repair circuit in order to achieve efficient and stable repair operation, corresponding with an input address which accesses a normal unit cell or a spare unit cell, by retaining operation margin stability.

In accordance with an aspect of the present invention, there is provided a semiconductor device for comparing an input address with a repair address includes a signal controller for generating control signals; an address latch unit in response to the control signals for latching the address; N number of M-bit address comparators, each for comparing the address with the stored repair address; a comparator delay modeling block for delaying the control signal for a predetermined time, i.e., delay value of the M-bit address comparator; and a repair circuit controller in response to the delayed control signal output from the comparator delay modeling block for generating one of a repair address enable signal and a normal address enable signal based on a comparison result of the M-bit address comparator.

BRIEF DESCRIPTION OF DRAWINGS

The above and other objects and features of the present invention will become apparent from the following description of preferred embodiments taken in conjunction with the accompanying drawings, in which:

FIG. 2 is a block diagram showing the unit repair address comparator shown in FIG. 1;

FIG. 3 is a schematic circuit diagram describing the fuse enable unit shown in FIG. 2;

DETAILED DESCRIPTION OF THE INVENTION

Hereinafter, a semiconductor memory device having an advanced repair circuit according to the present invention will be described in detail referring to the accompanying drawings.

Figure 12:
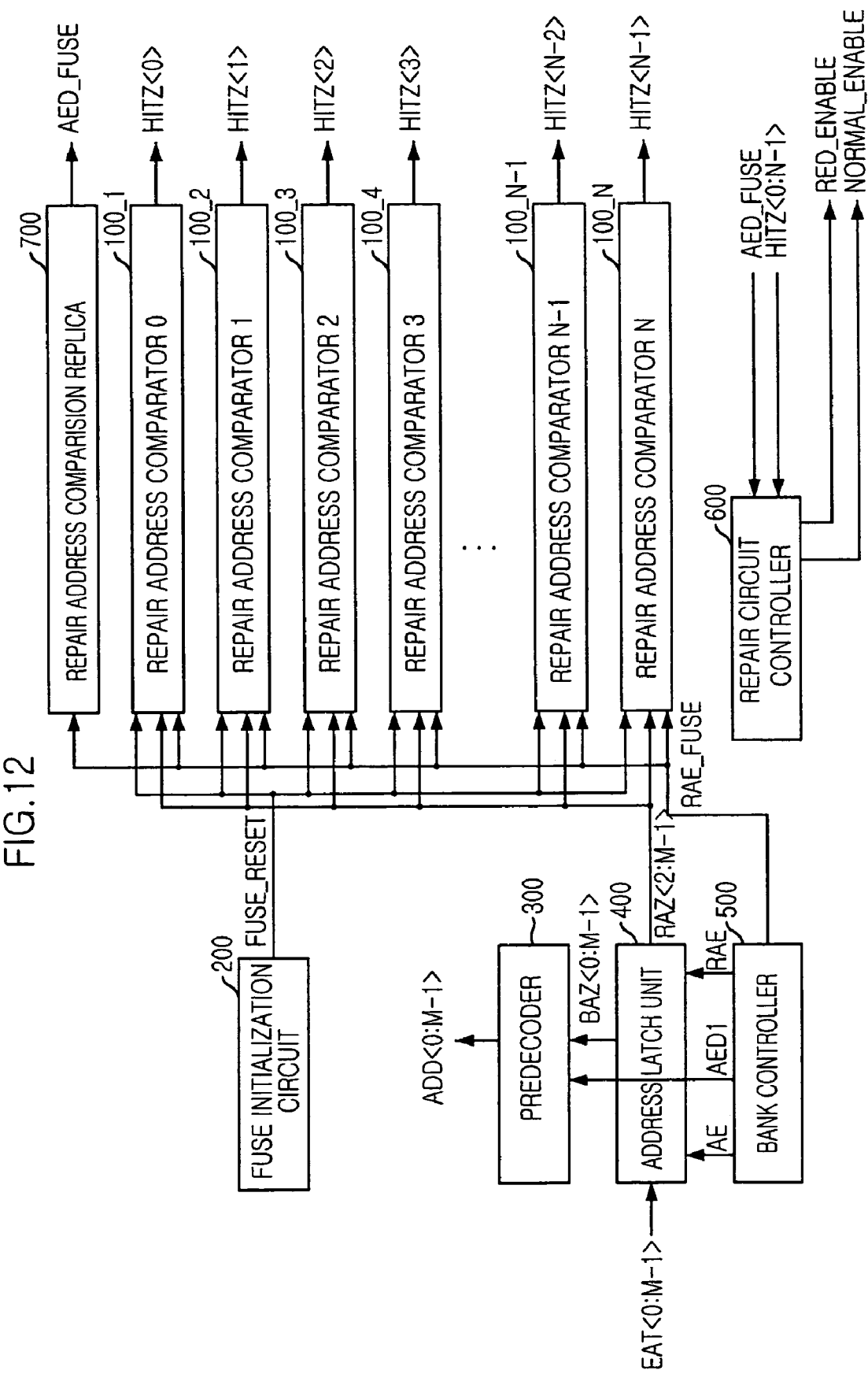
FIG. 12 is a block diagram showing a redundancy circuit of the semiconductor memory device in accordance with a preferred embodiment of the present invention.

FIG. 12 is a block diagram showing a redundancy circuit of the semiconductor memory device in accordance with a preferred embodiment of the present invention.

As shown, the semiconductor memory device in accordance with the present invention includes a bank controller 500, an address latch unit 400, a plurality of repair address comparators 100_1 to 100_N, a repair address comparison replica 700 and a repair circuit controller 600.

The bank controller 500 generates an enabling signal RAE_FUSE for adjusting the redundancy circuit. The address latch unit 400 latches an input address EAT<0:M−1>. The plurality of repair address comparators 100_1 to 100_N store repair addresses respectively and output the plurality of activated repair signals HITZ<0:N> when a latched address of the address latch unit 400 is the same as the stored repair address. Until the plurality of repair signals HITZ<0:N> are activated after the latched address of the address latch unit 400 is input to the plurality of repair address comparators 100_1 to 100_N, the comparison replica 700 delays the enabling signal RAE_FUSE. The repair circuit controller 600 outputs a normal circuit enabling signal NORMAL_ENABLE and a redundancy circuit enabling signal RED_ENABLE for operating a normal circuit or a redundancy circuit in response to the plurality of repair signals HITZ<0:N>. Herein, the repair circuit controller 600 is enabled by the delayed enabling signal AED_FUSE output from the repair address comparison replica 700. In additional, the plurality of repair address comparators 100_1 to 100_N is activated by the enabling signal RAE_FUSE output from the bank controller 500.

Figure 13:
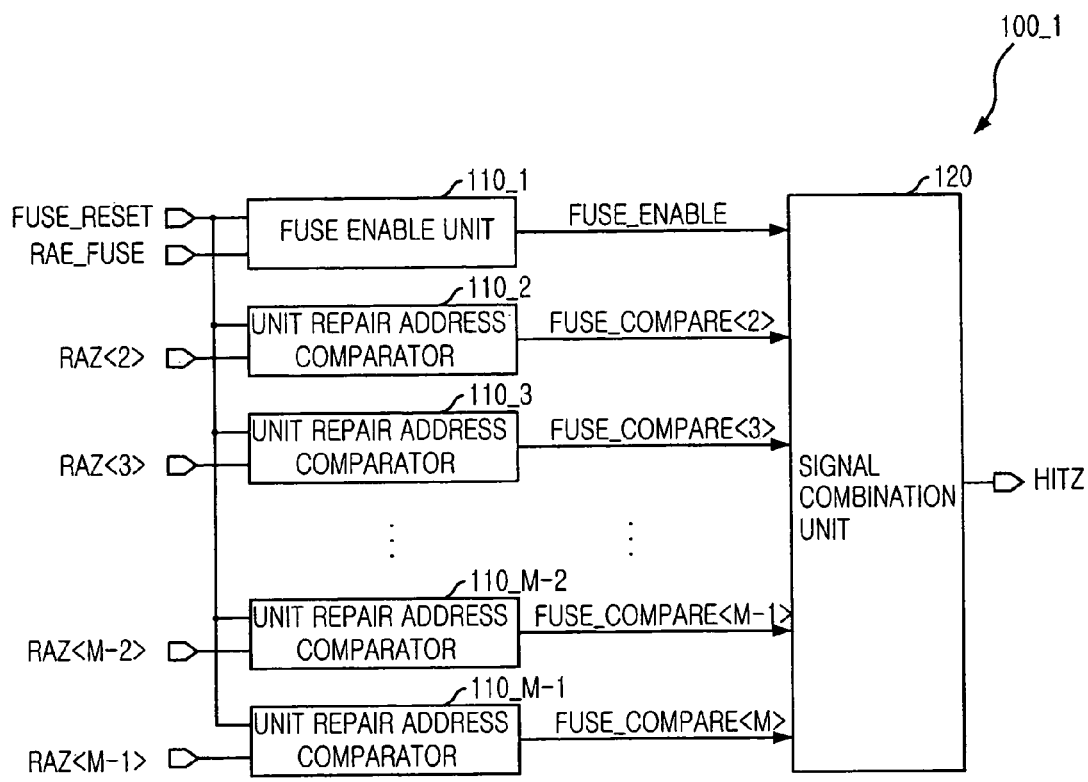
FIG. 13 is a block diagram describing one of the plurality of repair address comparators shown in FIG. 12.

FIG. 13 is a block diagram describing one of the plurality of repair address comparators 100_1 to 100_N shown in FIG. 12.

As shown, one repair address comparator 100_1 includes a fuse enabling unit 110_1, a plurality of unit repair address comparators 110_1 to 110_M−1 and a signal combination unit 120.

The fuse enabling unit 110_1 receives the enabling signal RAE_FUSE in response to whether an enabling fuse is blown out or not and outputs the fuse enabling signal FUSE_ENABLE. The plurality of unit repair address comparators 110_2 to 110_M−1 individually compare the stored one bit repair address with one bit latched address, e.g., RAZ<2>, of the address latch unit 400. The signal combination unit 120 outputs one bit of the repair signals HITZ<0:N> in response to comparison results of the plurality of unit repair address comparators 110_2 to 110_M−1 which are enabled by the fuse enabling signal FUSE_ENABLE.

Figure 14:
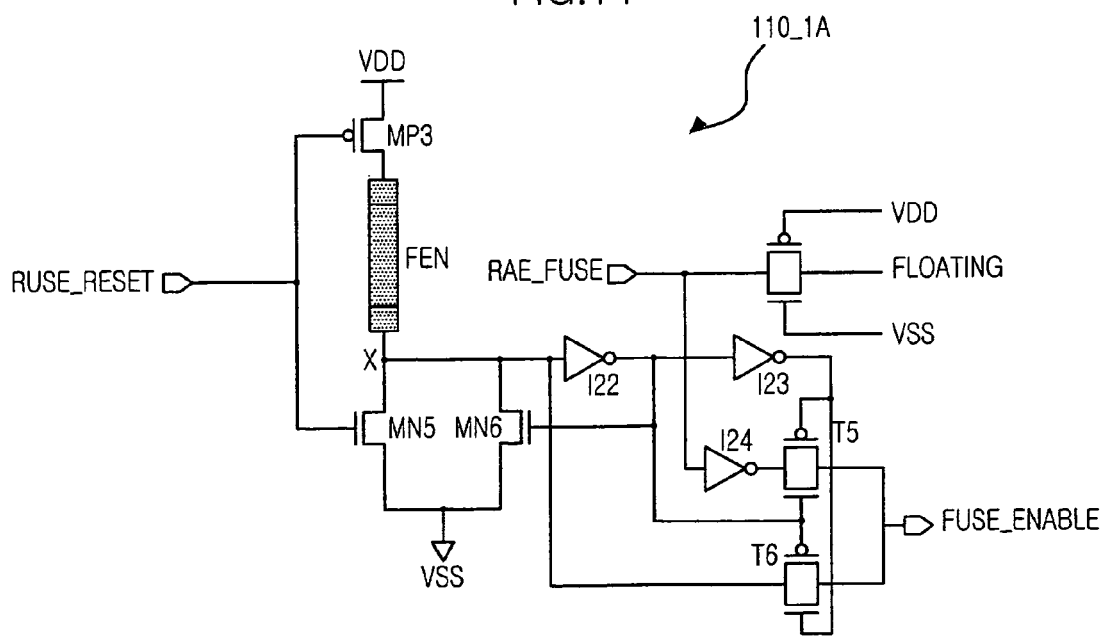
FIG. 14 is a schematic circuit diagram depicting a first embodiment of the fuse enabling unit shown in FIG. 13.

FIG. 14 is a schematic circuit diagram depicting a first embodiment of the fuse enabling unit 110_1 shown in FIG. 13.

As shown, the fuse enabling unit 110_1 includes a first to a third MOS transistors, MP3, MN5 and MN 6, a first enable fuse FEN1, a first and a second inverters, I22 and I23, and a first and a second transmission gates, T5 and T6.

The enable fuse FEN is coupled to the first and second MOS transistors MP3 and MN5. The first MOS transistor MP1 is connected to a supply voltage VDD. The second MOS transistor MN5 is connected to a ground voltage VSS. Gates of the first MOS transistor MP3 and the second MOS transistor MN5 are supplied with a fuse reset signal FUSE_RESET. The first inverter I22 receives a supplied signal of a node X between the enable fuse FEN and the second MOS transistor MN5 and outputs the inverse signal to the second inverter I22. The gate of the third MOS transistor MN6 is coupled to an output terminal of the first inverter I22. The drain and source of the third MOS transistor MN6 are coupled to the node X and the ground voltage VSS. The second inverter I23 inverts the output signal from the first inverter I22. The first and the second transmission gates T5 and T6 are controlled by output signals from the first and the second inverters I22 and I23. The first transmission gate T5 turns on when the enable fuse FEN is blown out and outputs the enabling signal RAE_FUSE as the fuse enabling signal FUSE_ENABLE. The second transmission gate T6 turns on when the enable fuse FEN is not blown out and outputs a supplied signal at source of the second MOS transistor MN5 as the fuse enabling signal FUSE_ENABLE.

Furthermore, the fuse enable unit 110_1 includes a third inverter I24 in order to delay the enabling signal RAE_FUSE for a predetermined time until comparing one bit latched address RAZ<2> with one bit stored repair address after receiving the one bit latched address RAZ<2>.

Figure 15:
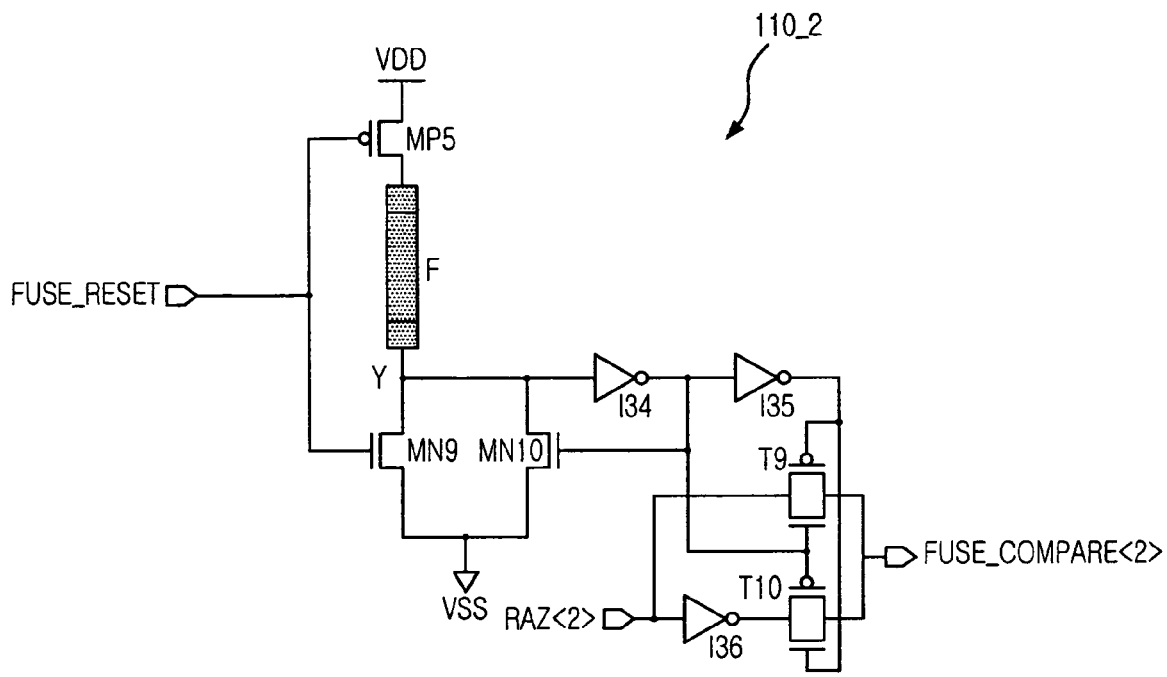
FIG. 15 is a schematic circuit diagram describing the unit address comparator shown in FIG. 13.

Herein, the predetermine time is a delay time of the inverse latched address /RAZ<2> shown in FIG. 15, i.e., a gate delay of I36.

FIG. 15 is a schematic circuit diagram describing the unit address comparator, e.g., 110_2, shown in FIG. 13.

As shown, the unit repair address comparator 110_2 includes an address fuse F, a fourth MOS transistor MP5, a fifth MOS transistor MN9, a sixth MOS transistor MN10, a fourth inverter I34, a fifth inverter I35, a sixth inverter I36, a third transmission gate T9 and a fourth transmission gate T10.

The address fuse F is coupled to the fourth and fifth MOS transistors MP5 and MN9. The fourth MOS transistor MP5 is coupled to the supply voltage VDD. The fifth MOS transistor MN9 is coupled to the ground voltage VSS. Gates of the fourth MOS transistor MP5 and the fifth MOS transistor MN9 are supplied with the fuse reset signal FUSE_RESET. The fourth inverter I34 receives a supplied signal of a node Y between the address fuse F and the fifth MOS transistor MN9 and outputs the inverse signal to the fifth inverter I35. Gate of the sixth MOS transistor MN10 is coupled to an output terminal of the fourth inverter I34. Source and drain of the third MOS transistor MN2 are coupled to the node Y and the ground voltage VSS. The fifth inverter I35 inverts the output signal from the fourth inverter I34. The output signals from the fourth inverter I34 and the fifth inverter I35 control the third and the fourth transmission gates T9 and T10. The third transmission gate T9 is turned on for transmitting the one bit latched address RAZ<2> to the signal combination unit 120 if the address fuse F blows out. The fourth transmission gate T10 is turned on for transmitting the inverse latched address /RAZ<2> which is inverted by the sixth inverter I36 to the signal combination unit 120 if the address fuse F does not blow out.

Figure 16:
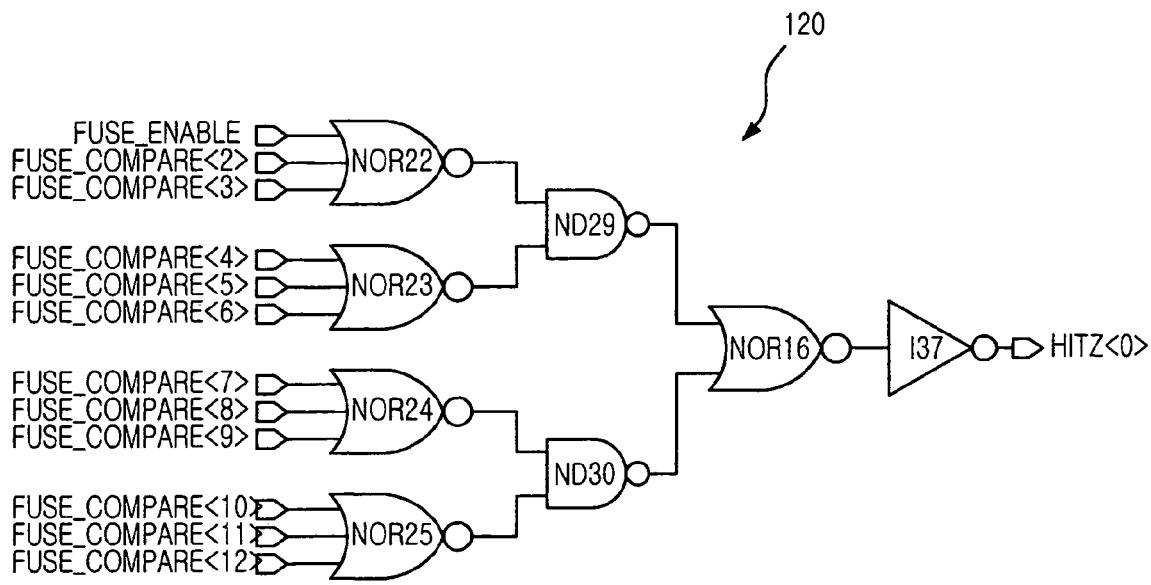
FIG. 16 is a schematic circuit diagram describing the signal combination unit shown in FIG. 13.

FIG. 16 is a schematic circuit diagram describing the signal combination unit 120 shown in FIG. 13.

As shown, the signal combination unit 120 includes a plurality of NOR gates NOR22 to NOR25, a plurality of NAND gates ND29 to ND30, a first NOR gate NOR16 and a seventh inverter I37. The plurality of NOR gates NOR22 to NOR25 receive the fuse enable signal FUSE_ENABLE and a plurality of comparison signals FUSE_COMPARE<2> to FUSE_COMPARE<M> which are output from the plurality of unit repair address comparators 110_1 to 110_M-1. Output signals from the plurality of NOR gates NOR22 to NOR25 are input to the plurality of NAND gates ND29 to ND30. The first NOR gates NOR16 receives signals output from the plurality of NAND gates ND29 to ND30. The seventh inverter I37 is used for inverting an output signal of the first NOR gate NOR16 and outputting the reverse signal as the repair signal HITZ<0>.

Figure 17:
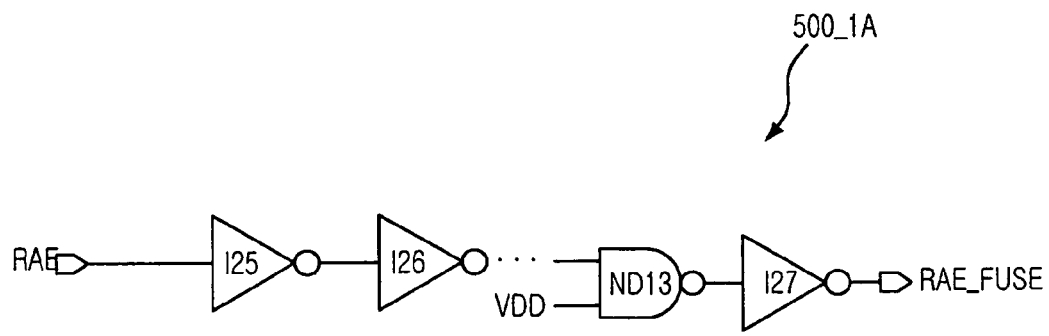
FIG. 17 is a schematic circuit diagram describing a partial circuit of a bank controller shown in FIG. 12 if the fuse enabling unit shown in FIG. 14 is used in the repair circuit of the semiconductor memory device in accordance with the present invention.

FIG. 17 is a schematic circuit diagram describing the partial circuit of the bank controller 500, shown in FIG. 12, in case when the fuse enabling unit 110_1 shown in FIG. 14 is used in the repair circuit of the semiconductor memory device in accordance with the present invention.

As shown, the enabling signal RAE_FUSE is output after delaying a first control signal RAE for a predetermined time by a NAND gate ND13 and serially connected inverters I25, I26 and I27 included in the bank controller 500.

Figure 18:
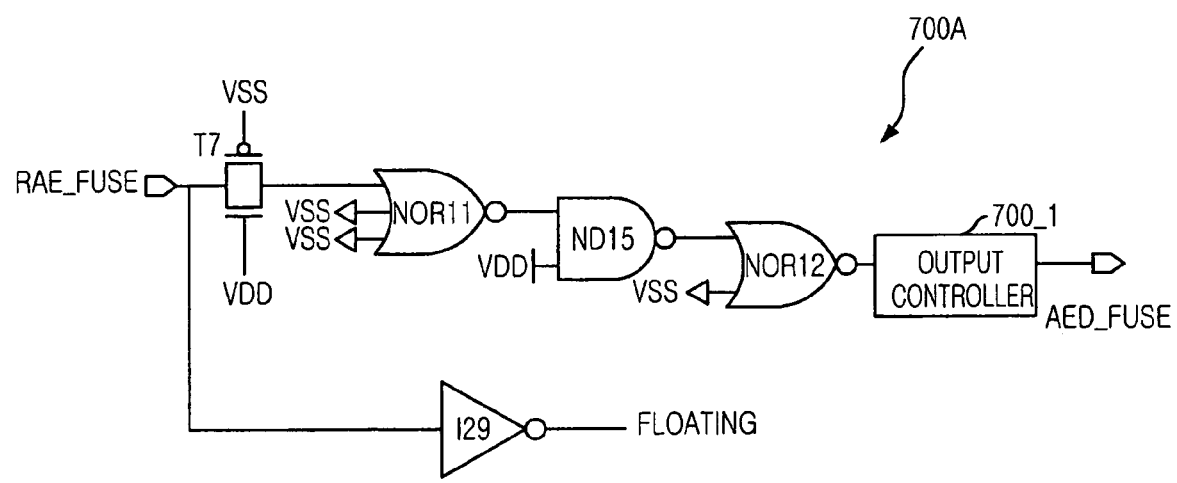
FIG. 18 is a schematic circuit diagram describing a repair address comparison replica shown in FIG. 12 if the fuse enabling unit 110_1 shown in FIG. 14 is used in the repair circuit of the semiconductor memory device in accordance with the present invention.

FIG. 18 is a schematic circuit diagram describing the repair address comparison replica 700A, shown in FIG. 12, when the fuse enabling unit 110_1 shown in FIG. 14 is used in the repair circuit of the semiconductor memory device in accordance with the present invention.

As shown, the repair address comparison replica 700A includes second and third NOR gates NOR11 and NOR12 and a first NAND gate ND15. The second NOR gates NOR11 receives the enabling signal RAE_FUSE and delays the enabling signal RAE_FUSE for a time when the plurality of comparison signals FUSE_COMPARE<2> to FUSE_COMPARE<M> output from the plurality of unit repair address comparators 110_1 to 110_M-1 are delayed by the plurality of NOR gates NOR22 to NOR25. The first NAND gate ND15 receives a signal output from the second NOR gate NOR11 and delays the signal for a time when the plurality of comparison signals FUSE_COMPARE<2> to FUSE_COMPARE<M> output from the plurality of unit repair address comparators 110_1 to 110_M-1 are delayed by the plurality of NAND gates ND29 to ND30. The third NOR gate NOR12 receives a signal output from the first NAND gate ND15 and delays the signal for a time when the plurality of comparison signals FUSE_COMPARE<2> to FUSE_COMPARE<M> output from the plurality of unit repair address comparators 110_1 to 110_M-1 are delayed by the first NOR gate NOR16.

In addition, the repair address comparison replica 700A shown in FIG. 18 further includes an output controlling unit 700_1 for adjusting phase and level of the signal output from the second NOR gate NOR11 in order to be the same as phase and level of the repair signal HITZ<0> which is output from the repair address comparator 100_1 and input to the repair circuit controller 600.

Figure 19:
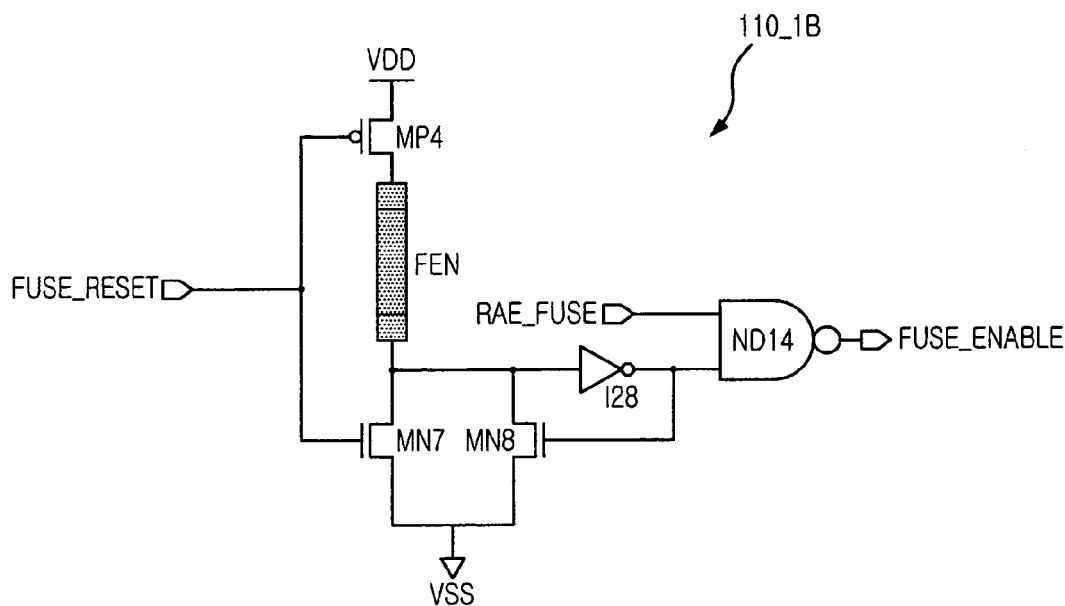
FIG. 19 is a schematic circuit diagram depicting a fuse enabling unit shown in FIG. 13 in accordance with a second embodiment of the present invention.

FIG. 19 is a schematic circuit diagram depicting a fuse enabling unit shown in FIG. 13 in accordance with a second embodiment of the present invention.

As shown, the fuse enabling unit 110_1B in accordance with a second embodiment of the present invention includes a seventh to a ninth MOS transistors MP4, MN7 and MN8, the enabling fuse FEN, a eighth inverter I28 and a second NAND gate ND14.

The enable fuse FEN is coupled to the seventh and eighth MOS transistors MP4 and MN7. The seventh MOS transistor MP4 is connected to a supply voltage VDD. The eighth MOS transistor MN7 is connected to a ground voltage VSS. Gates of the seventh MOS transistor MP4 and the eighth MOS transistor MN7 are supplied with the fuse reset signal FUSE_RESET. The eighth inverter I28 receives a supplied signal of a node X between the enable fuse FEN and the eighth MOS transistor MN7 and outputs the inverse signal to the second NAND gate ND14. The gate of the ninth MOS transistor MN8 is coupled to an output terminal of the eighth inverter I28. The source and drain of the ninth MOS transistor MN8 are coupled to the node X and the ground voltage VSS. The second NAND gate ND14 receives the enabling signal RAE_FUSE and an output signal of the eighth inverter I28 and outputs a result of NAND operation as the fuse enabling signal FUSE_ENABLE.

Figure 20:
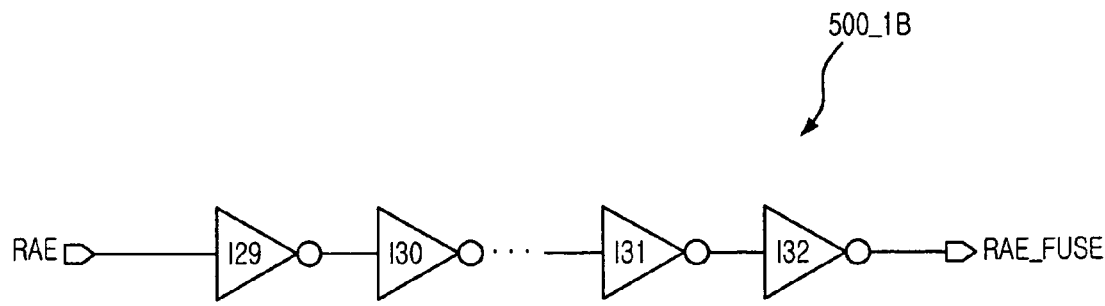
FIG. 20 is a schematic circuit diagram describing a partial circuit in the bank controller shown in FIG. 12 if the fuse enabling unit shown in FIG. 19 is used in the repair circuit of the semiconductor memory device in accordance with the present invention.

FIG. 20 is a schematic circuit diagram describing a partial circuit for generating the enabling signal RAE_FUSE in the bank controller 500 which is shown in FIG. 12, in case when the fuse enabling unit 110_1B shown in FIG. 19 is used in the repair circuit of the semiconductor memory device in accordance with the present invention.

As shown, the enabling signal RAE_FUSE is output after delaying the first control signal RAE for a predetermined time by using serially connected inverters I29, I30 and I32.

Figure 21:
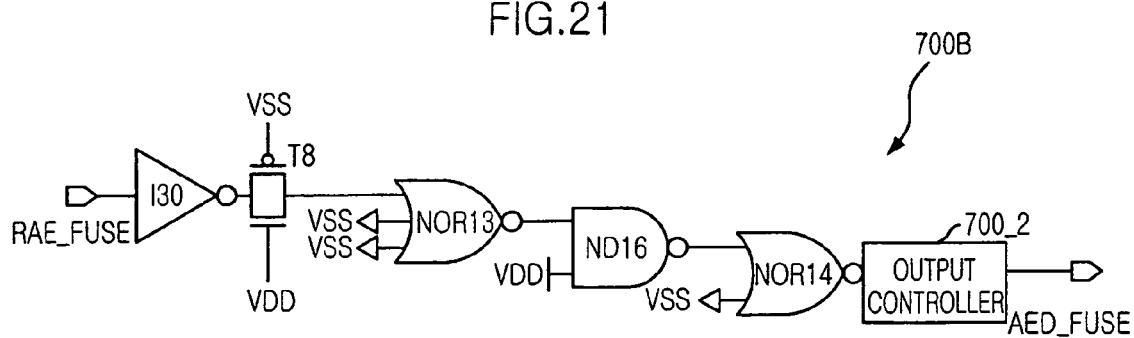
FIG. 21 is a schematic circuit diagram showing the repair address replica shown in FIG. 12 if the fuse enabling unit 110_1B shown in FIG. 19 is used in the repair circuit of the semiconductor memory device in accordance with the present invention.

FIG. 21 is a schematic circuit diagram showing the repair address replica, shown in FIG. 12, when the fuse enabling unit 110_1B shown in FIG. 19 is used in the repair circuit of the semiconductor memory device in accordance with the present invention.

As shown, the repair address comparison replica 700B includes a ninth inverter I30, a fourth NOR gate NOR13, a fourth NAND gate ND16 and a fifth NOR gate NOR14.

After receiving the enabling signal RAE_FUSE, the ninth inverter I30 is used for equalizing phase of the enabling signal RAE_FUSE with phase of the fuse enabling signal FUSE_ENABLE output from the fuse enabling unit 110_1B. The fourth NOR gate NOR13 delays a signal output from the ninth inverter I30 for a time when the plurality of comparison signals FUSE_COMPARE<2> to FUSE_COMPARE<M> output from the plurality of unit repair address comparators 110_1 to 110_M-1 are delayed by the plurality of NOR gates NOR22 to NOR25. The fourth NAND gate ND16 receives a signal output from the fourth NOR gate NOR13 and delays the signal for a time when the plurality of comparison signals FUSE_COMPARE<2> to FUSE_COMPARE<M> output from the plurality of unit repair address comparators 110_1 to 110_M-1 are delayed by the plurality of NAND gates ND29 to ND30. The fifth NOR gate NOR14 delays a signal output from the fourth NAND gate ND16 for a time when the plurality of comparison signals FUSE_COMPARE<2> to FUSE_COMPARE<M> output from the plurality of unit repair address comparators 110_1 to 110_M-1 are delayed by the first NOR gate NOR16.

In addition, the repair address comparison replica 700B shown in FIG. 21 further includes an output controlling unit 700_2 for adjusting phase and level of the signal output from the fifth NOR gate NOR14 in order to be the same as the phase and level of the repair signal HITZ<0> which is output from the repair address comparator 100_1 and input to the repair circuit controller 600.

Figure 22:
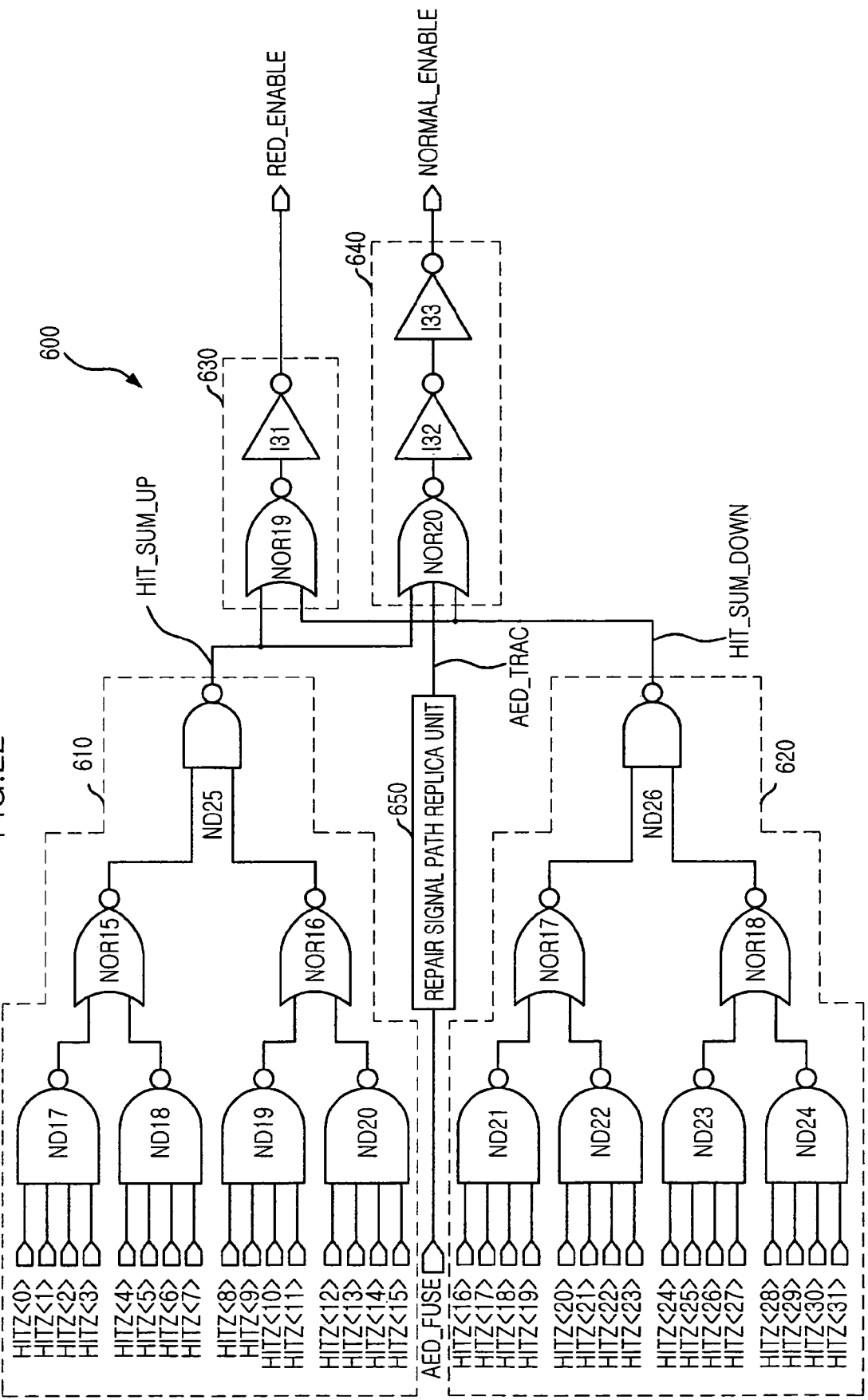
FIG. 22 is a schematic circuit diagram showing a repair circuit controller shown in FIG. 12.

FIG. 22 is a schematic circuit diagram showing the repair circuit controller 600 shown in FIG. 12. This repair circuit controller 600 is used when the number of the repair address comparators included in repair circuit is 32.

As shown, the repair circuit controller 600 includes a first and a second repair signal compounding units 610 and 620, a repair signal path replica 650, a first output driver 630 and a second output driver 640.

The first repair signal compounding unit 610 receives the plurality of repair signals HITZ<0:15> output from the repair address comparators 100_1 to 100_N and outputs a first result signal HIT_SUM_UP. Also, the second repair signal compounding unit 620 receives the plurality of repair signals HITZ<16:31> output from the repair address comparators 100_1 to 100_N and outputs a second result signal HIT_SUM_DOWN. The repair signal path replica 650 delays the delayed enabling signal AED_FUSE output from the repair address comparison replica 700 for a predetermined time until the first and second result signals HIT_SUM_UP and HIT_SUM_DOWN are output after the plurality of repair signals HITZ<0:N> are input. The first output driver 630 outputs the redundancy circuit enabling signal RED_ENABLE for activating the redundancy circuit in response to values of the first and the second result signals HIT_SUM_UP and HIT_SUM_DOWN. The second output driver 640 outputs the normal circuit enabling signal NORMAL_ENABLE for activating the normal circuit in response to values of the first and the second result signals HIT_SUM_UP and HIT_SUM_DOWN.

In detail, each of the first and the second repair signal compounding units 610 and 620 has a plurality of NAND gates, ND17 to ND20 or ND21 to ND24, for receiving the plurality of repair signals, HITZ<0:15> or HITZ<16:31>, a plurality of NOR gates, NOR15 to NOR16 or NOR17 to NOR18, for receiving output signals from the plurality of NAND gates, ND17 to ND20 or ND21 to ND24, and a sixth NAND gate, ND25 or ND26, for receiving output signals from the plurality of NOR gates, NOR15 to NOR16 or NOR17 to NOR18, and outputting the first or the second result signal, HIT_SUM_UP or HIT_SUM_DOWN.

The first output driver 630 having a NAND gate and an inverter receives the first and the second result signals HIT_SUM_UP and HIT_SUM_DOWN and outputs the redundancy circuit enabling signal RED_ENABLE, but the second output driver 640 having a NAND gate and two inverters receives the first and the second result signals HIT_SUM_UP and HIT_SUM_DOWN and the output signal AED_TRAC from the repair signal path replica 650 and outputs the normal circuit enabling signal NORMAL_ENABLE.

Figure 23:
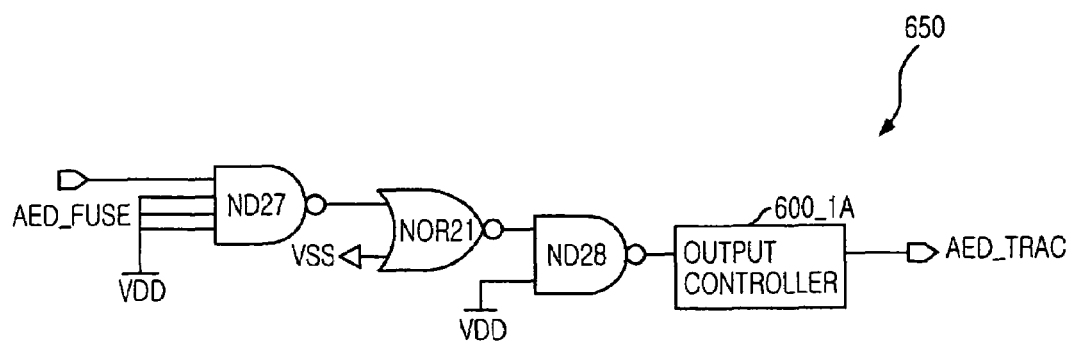
FIG. 23 is a schematic circuit diagram depicting a repair signal path replica shown in FIG. 22.

FIG. 23 is a schematic circuit diagram depicting the repair signal path replica 650 shown in FIG. 22.

As shown, the repair signal path replica 650 includes a seventh NAND gate ND27, a sixth NOR gate NOR21, a eighth NAND gate ND28 and a first output controller 600_1A.

In detail, the seventh NAND gate ND27 receives the delayed enabling signal AED_FUSE output from the repair address comparison replica 700 and delays the delayed enabling signal AED_FUSE for a time when the plurality of repair signals HITZ<0:N> output from the plurality of repair address comparators 110_1 to 110_N are delayed by the plurality of NAND gates ND17 to ND24. The sixth NOR gate NOR21 receives a signal output from the seventh NAND gate ND27 and delays the signal for a time when the plurality of repair signals HITZ<0:N> output from the plurality of repair address comparators 110_1 to 110_N are delayed by the plurality of NOR gates NOR15 to NOR18. The eighth NAND gate ND28 receives a signal output from the sixth NOR gate NOR21 and delays the signal for a time when the plurality of repair signals HITZ<0:N> output from the plurality of repair address comparators 110_1 to 110_N are delayed by the plurality of NAND gates ND25 and ND26.

In addition, the repair signal path replica 650 further includes the second output controlling unit 600_1A for adjusting phase and level of the signal output from the eight NAND gate ND28 in order to be equal with phase and level of the first and the second result signals HIT_SUM_UP and HIT_SUM_DOWN output from the first and the second repair signal compounding units 610 and 620.

Figure 24:
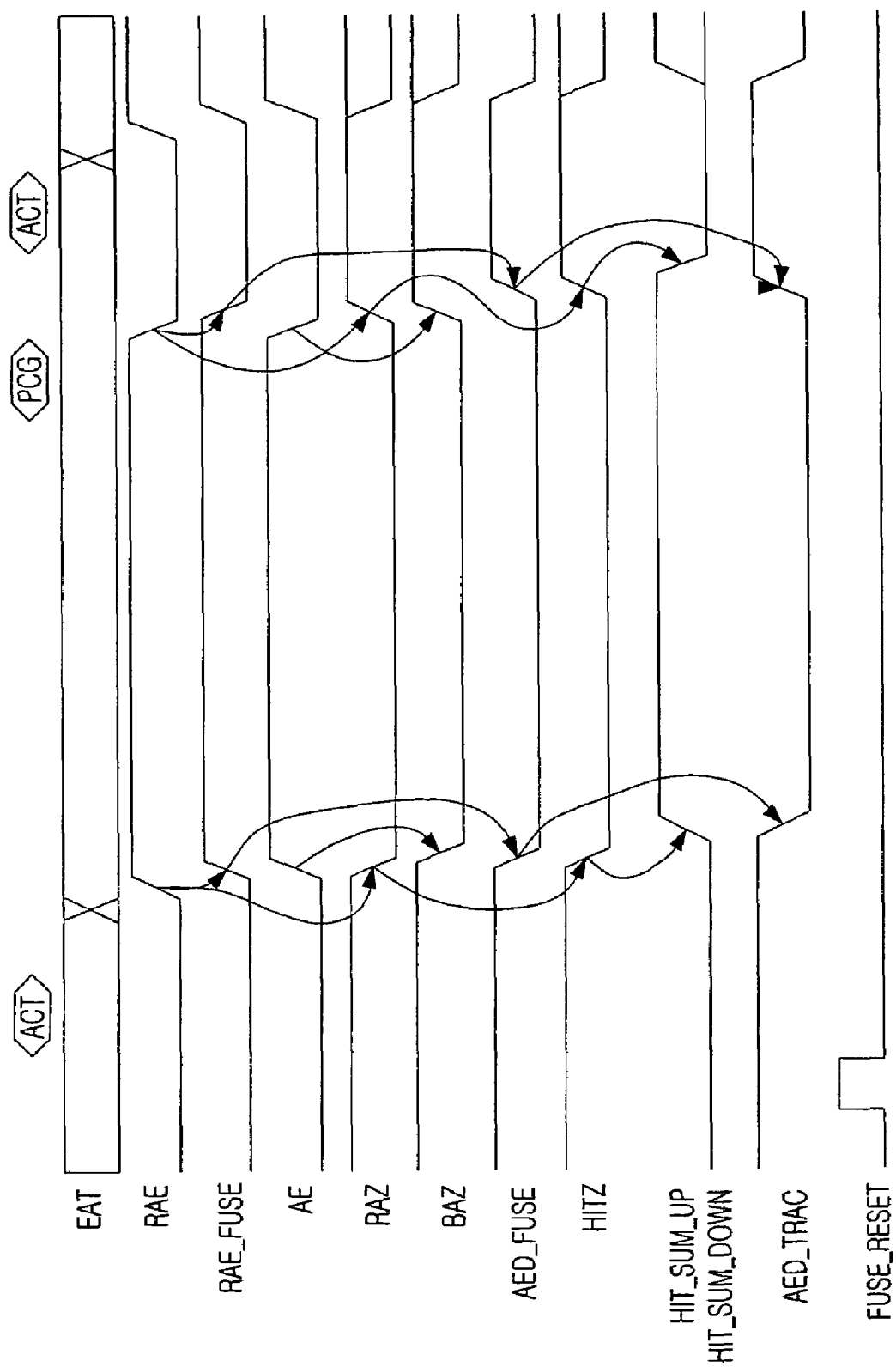
FIG. 24 is a waveform showing operation of the semiconductor memory device shown in FIG. 12.

FIG. 24 is a waveform describing operation of the invented semiconductor memory device shown in FIG. 12. Hereinafter, referring to FIG. 12 to 24, the operation of the semiconductor memory device in accordance with the present invention is described in detail.

If some error of the unit cells in the semiconductor memory device is detected after the semiconductor memory device is manufactured, the repair operation of the memory device should act in order to access the spare cell unit which is prepared for substituting the faulty cell unit. In this process, one of the repair address comparators is used for alternating one address of the faulty cell unit with one address of the spare cell unit.

First, in order to substitute one address of the faulty cell unit with that of the spare cell unit, one of the plurality of repair address comparators 110_1 to 110_N is selected. Then, in the selected repair address comparator, e.g., 100_1, the enabling fuse FEN of the fuse enabling unit 100_1 is blown out by irradiating with a laser.

In response to the address of the faulty cell unit, the address fuse included in each of the unit address comparators 110_2 to 110_M−1 is blown out or not. Namely, one repair address is stored in one repair address comparator. For instance, if the number of repair address comparators in the repair circuit is 32, the repair circuit can substitute each of the 32 addresses of the faulty cell units with each of the 32 repair addresses of the spare cell units.

Continuously, if an address EAT<0:M−1> for accessing data is input to the memory device, the address EAT<0:M−1> is buffered by an address input buffer, not shown in any figure, and the buffered address EAT<0:M−1> is input to the address latch unit 400. After receiving the buffered address EAT<0:M−1>, the address latch unit 400 outputs either the normal address BAZ<0:M−1> to the predecoder 300 in response to a second control signal AE output from the bank controller 500 or the latched address RAZ<2:M−1> to the plurality of repair address comparators 100_1 to 100_N in response to the first control signal RAE output from the bank controller 500.

The predecoder 300 decodes the normal address BAZ<0:M−1> and outputs a decoded address ADD<0:M−1> to the main decoder, not shown in any figure. The main decoder receives the decoded address from the predecoder 300 and decodes the decoded address ADD<0:M−1> for accessing the data stored in cell unit.

Herein, the latched address RAZ<2:M−1> has two fewer bits than the buffered address EAT<0:M−1> does, because one repair address can be decoded into four redundancy word lines when the normal word line is decoded in a typical memory device.

The plurality of repair address comparators 100_1 to 100_N respectively receive one bit of the repaired address RAZ<2:M−1> and individually determine whether the latched address RAZ<2:M−1> is the repair address or not. As a result, the repair signal, e.g., HITZ<0>, is output.

Herein, operation of outputting the repair signal, e.g., HITZ<0>, is described in more detail. If the enable fuse FEN included in the fuse enabling unit 110_1 is blown out by the laser, the fuse enabling signal FUSE_ENABLE is activated at logical low and output to the signal combination unit 120.

As shown in FIGS. 14 and 19, there are the first and the second exemplary embodiments of the fuse enabling unit in accordance with the present invention. First, the first exemplary embodiment is described in detail.

The unit repair address comparator shown in FIG. 14 has the same structure as the unit repair address comparator shown in FIG. 15. If the enabling fuse FEN included in the fuse enabling unit 110_1A is blown out, the enabling signal RAE_FUSE which is input after being activated at logical high from the bank controller 500 passes through a first transmission gate T5 and is output to the signal combination unit 120 as the fuse enabling signal FUSE_ENABLE.

Otherwise, if the enable fuse FEN is not blown out, the logical high signal input to the first inverter I22 is delivered to the second transmission gate T6 as the fuse enabling signal FUSE_ENABLE. Herein, the third inverter I24 is used in order to delay one bit address RAZ<2> input to the unit repair address comparators 110_2 for a predetermined time when the enabling signal RAE_FUSE is output as the fuse enabling signal FUSE_ENABLE, i.e., a delay value of the inverter I36. Thus, a delay value of process that the fuse enabling unit 110_1 outputs the fuse enabling signal FUSE_ENABLE after receiving the enabling signal RAE_FUSE is the same as a delay value of process that the unit repair address comparators 110_2 outputs the address comparison signal, e.g., FUSE_COMPARATOR<2>, after receiving the address, e.g., RAZ<2>.

Meanwhile, the fuse reset signal FUSE_RESET is output to the fuse enabling unit 110_1 and the plurality of unit address comparators 110_2 to 110_M−1 in a pulse shape having a low-high-low state at initial operation. So, if the enable fuse FEN is not blown out, the second transmission gate T6 in the fuse enabling unit 110_1A is always turned on and, as a result, the fuse enabling signal is not activated at logical high. If the address fuse F is not blown out, the fourth transmission gate T10 in the unit repair address comparator 110_2 is also always turned on. As a result, input address EAT<0:M−1> is inverted and output as the address comparison signal FUSE_ENABLE<2>.

The structure and operation of the signal combination unit 120 in the present invention is similar to those in the prior art. The signal combination unit as shown in FIG. 16 is used when the number of unit repair addresses is 11. If the fuse enabling signal FUSE_ENABLE and all comparison signals FUSE_COMPARE<2:12> are activated at logical low, the repair signal HITZ<0> is output to the repair circuit controller 600 after being activated at logical low.

Figure 1:
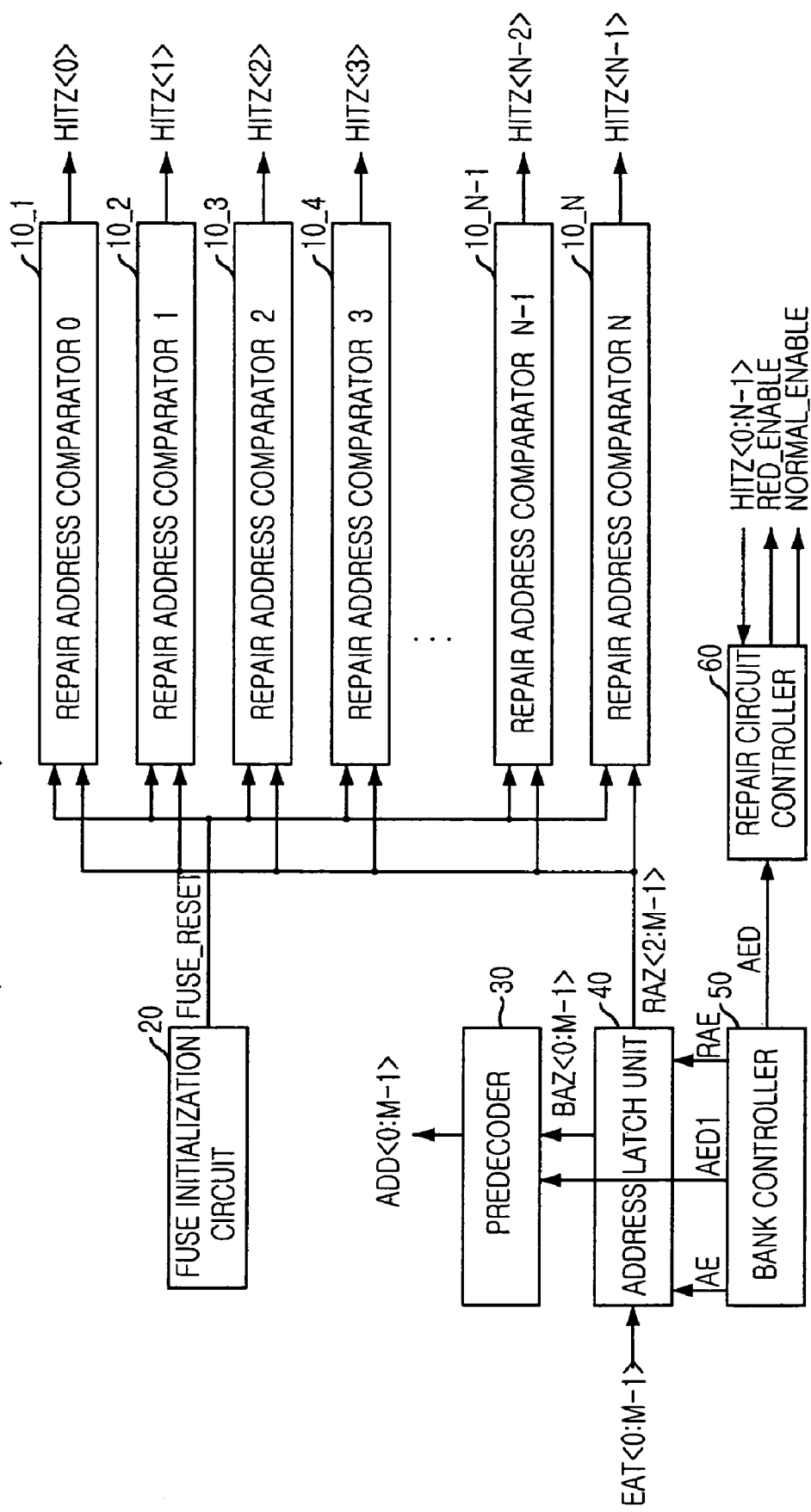
FIG. 1 is a block diagram showing a repair circuit of the conventional semiconductor memory device.
Figure 4:
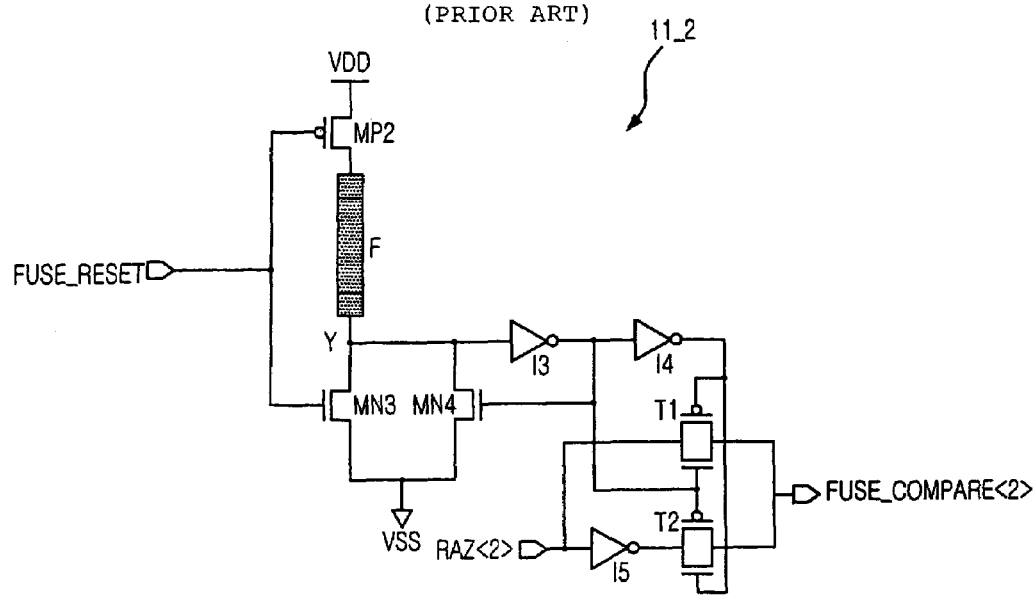
FIG. 4 is a schematic circuit diagram depicting one of a plurality of the repair address comparators shown in FIG. 2.
Figure 5:
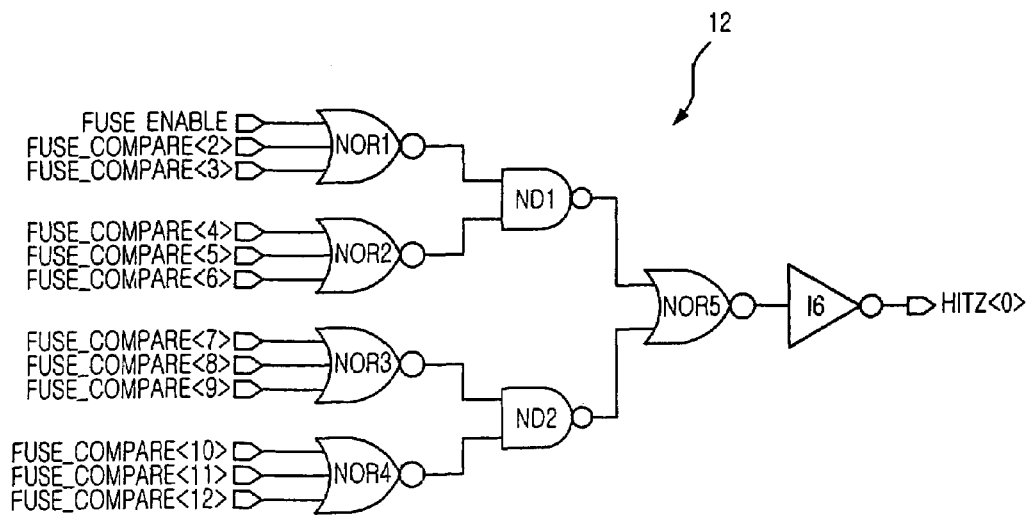
FIG. 5 is a schematic circuit diagram describing the signal combination unit shown in FIG. 2.
Figure 6:
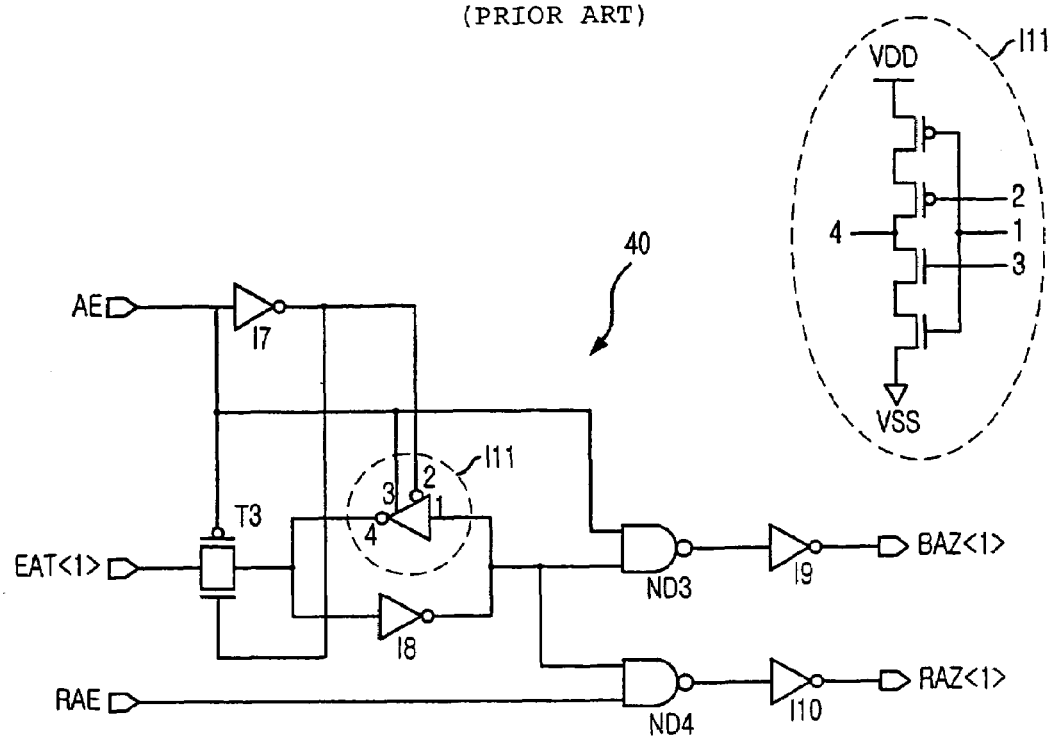
FIG. 6 is a schematic circuit diagram showing a first properly partial circuit of the address latch unit.
Figure 7:
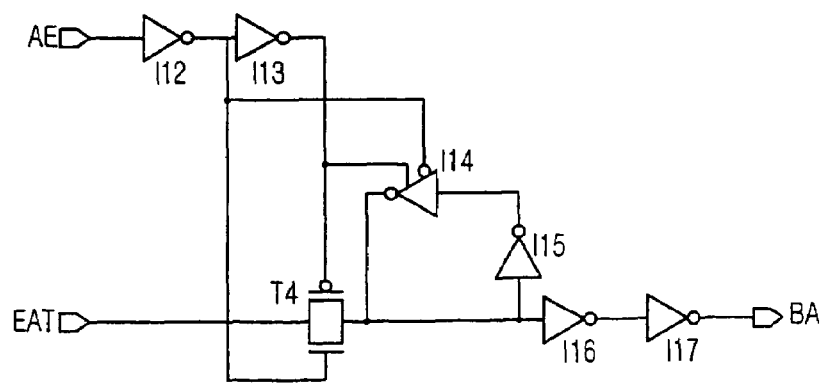
FIG. 7 is schematic circuit diagram depicting another example of a partial circuit in the address latch unit.
Figure 8:
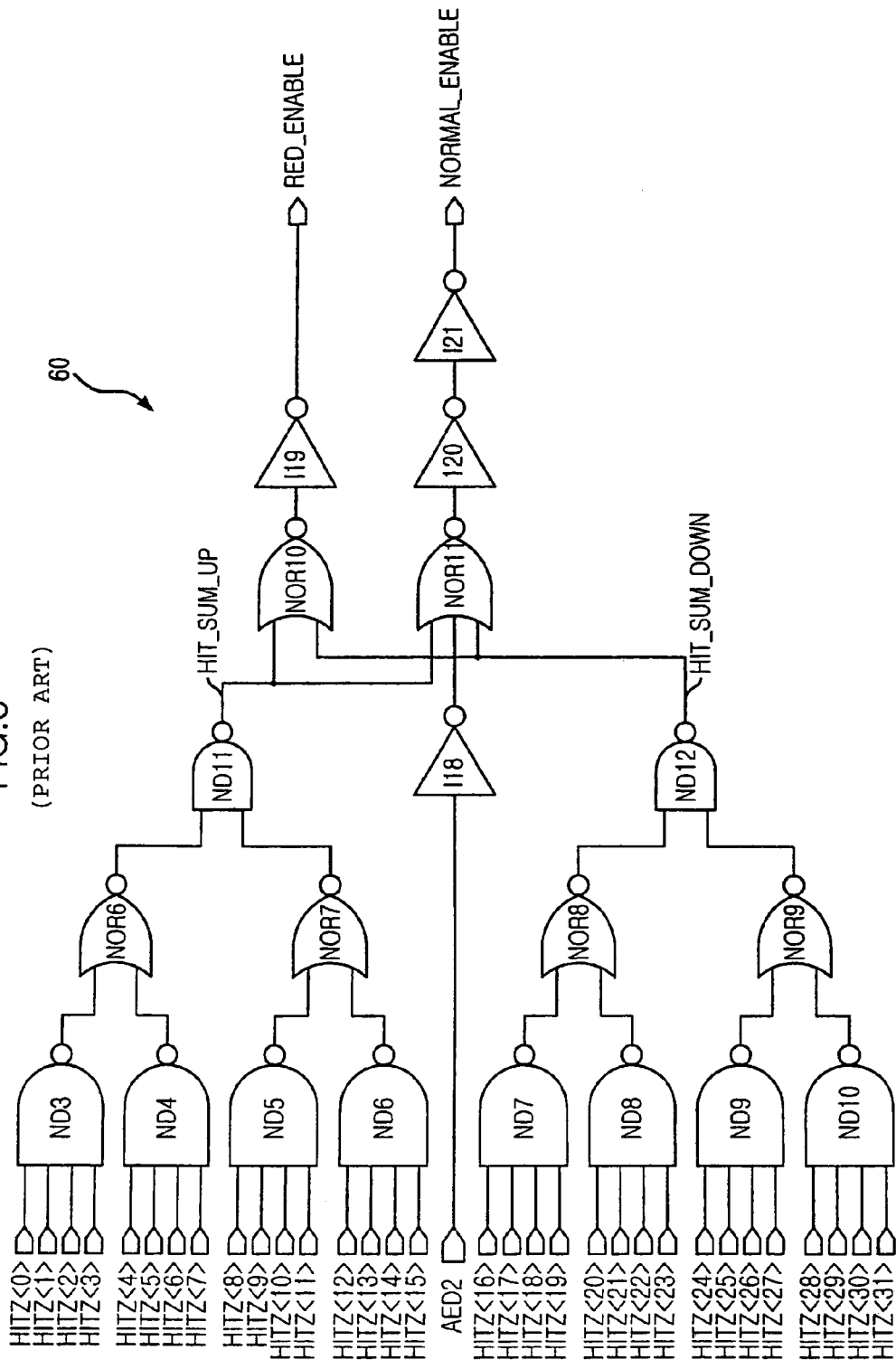
FIG. 8 is a schematic circuit diagram describing the repair circuit controller.
Figure 9:
FIG. 9 is a block diagram showing a partial block of the bank controller shown in FIG. 1.
Figure 10:
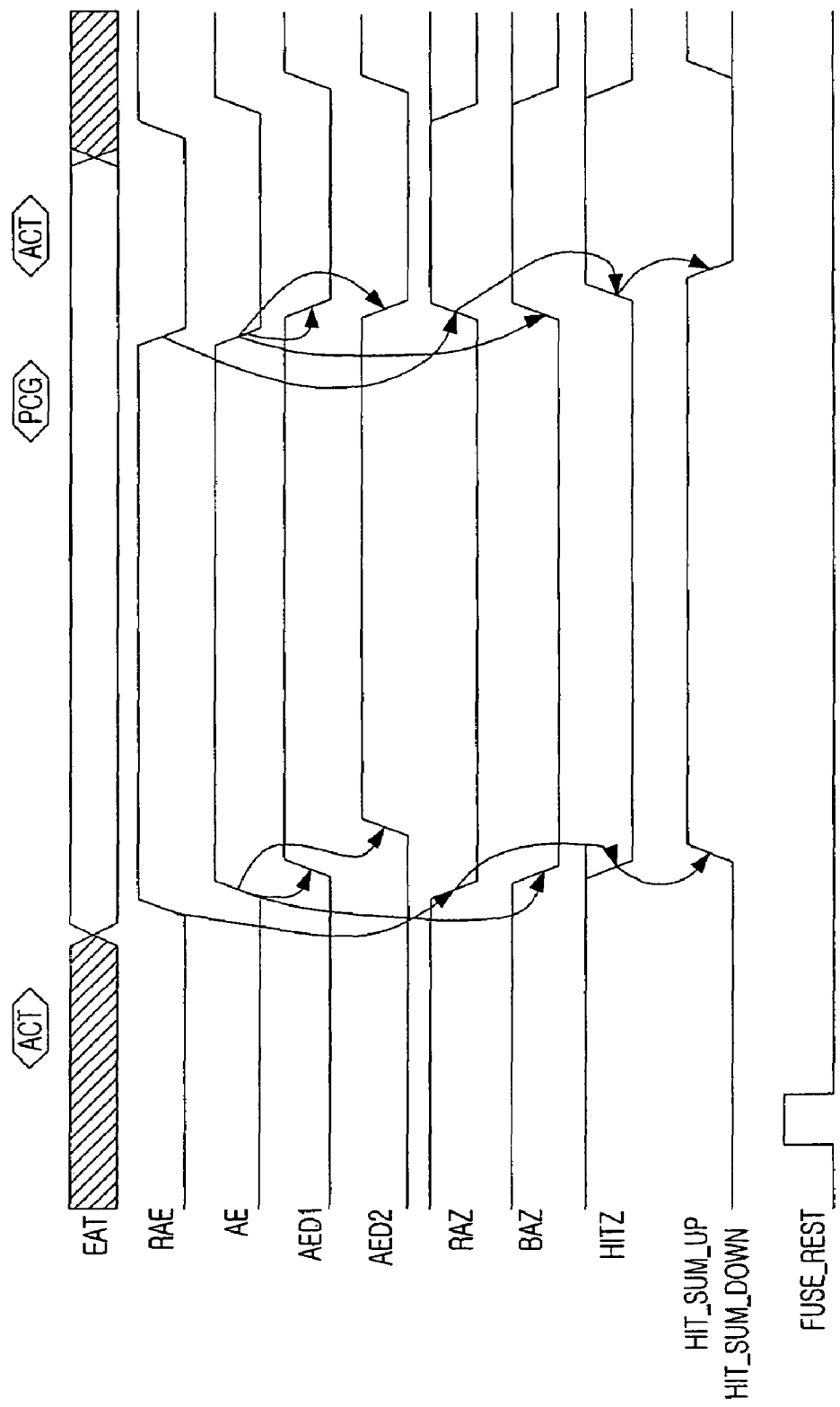
FIG. 10 is a waveform demonstrating the repair operation of the memory device shown in FIG. 1.
Figure 11:
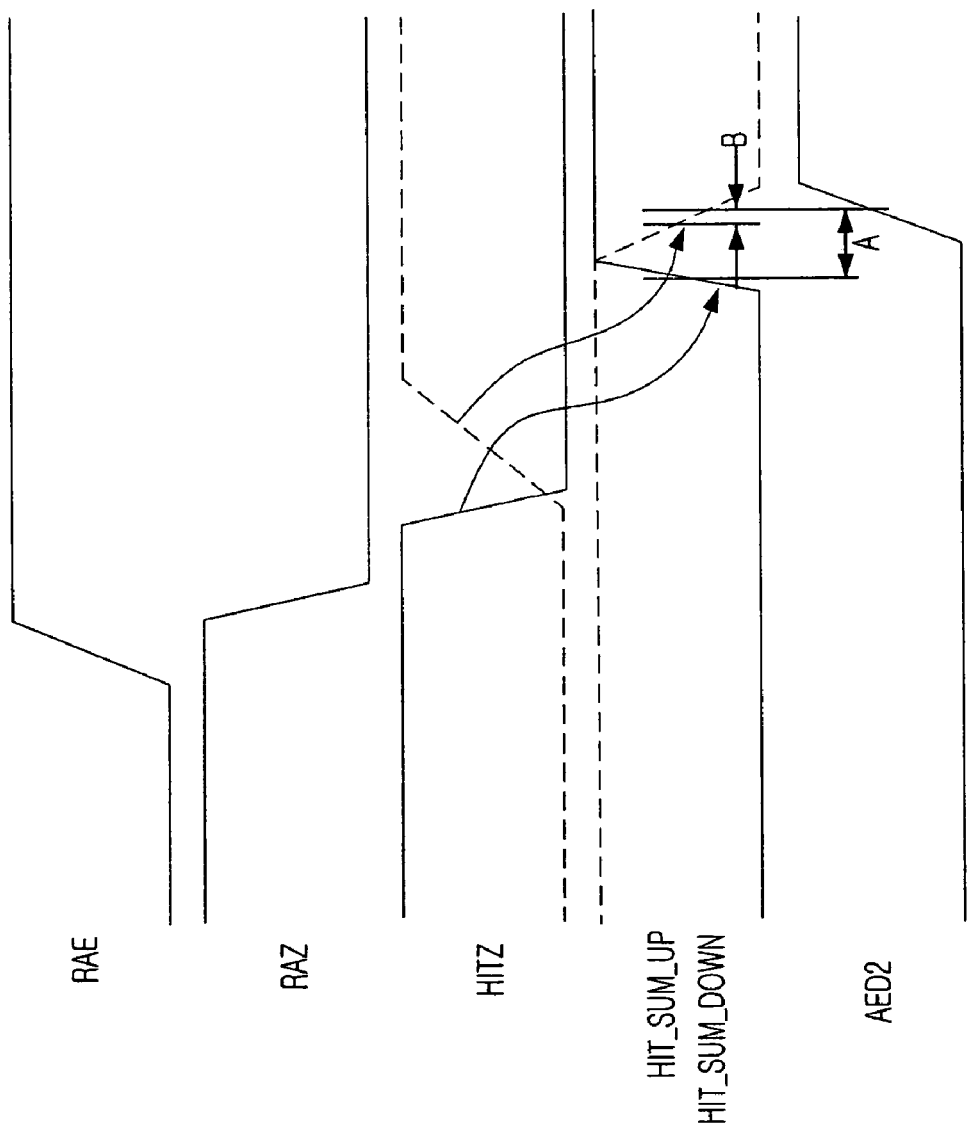
FIG. 11 is a waveform showing operation problem of the memory device shown in FIG. 1.

FIG. 17 reproduced from FIG. 6 says that the enabling signal RAE_FUSE is made by delaying a control signal RAE which is output from the bank controller 500 for a predetermined time. Also, the enabling signal RAE_FUSE is generated by using the circuit shown in FIG. 20.

The repair address comparison replica 700A shown in FIG. 18 is used when the fuse enabling unit 110_1A in accordance with the first embodiment of the present invention is applied to the repair address comparator.

The repair address comparison replica 700A receives the enabling signal RAE_FUSE and outputs the delayed enabling signal AED_FUSE which is delayed for a predetermined time in order to enable the repair circuit controller 600. The repair address comparison replica 700A copies the delay value from the path where the input address RAZ<2:M−1> is delivered in the repair address comparison unit 100_1. More particularly, the repair address comparison replica 700_A shown in FIG. 18 copies the delay value from the signal path of the unit signal combination unit 120.

Thus, the delayed enabling signal AED_FUSE having steady timing margin is input to the repair circuit controller 600, corresponding with the repair signal output from the repair address comparison unit.

FIG. 20 is a schematic circuit diagram of the fuse enabling unit in accordance with the second embodiment of the present invention. Herein, if the fuse reset signal FUSE_RESET is input and then the enabling fuse FEN is blown out, the output signal of the eighth inverter I28 is at logical high. Otherwise, if the enabling fuse FEN is blown out, the output signal of the eighth inverter I28 is at logical low.

As shown, the fuse enabling unit can output the fuse enabling signal after receiving the enabling signal RAE_FUSE output from the bank controller 500.

FIG. 21 shows the repair address comparison replica 700_B which is used when the fuse enabling unit 110_1B shown in FIG. 19 is applied to the semiconductor memory device. The second embodiment of the repair address comparison replica 700_B shown in FIG. 21 is similar to the first embodiment of the repair address comparison replica 700_A shown in FIG. 18, but the second embodiment of the repair address comparison replica 700_B further includes the inverter I30 for equalizing the phase of the output signal with that of the enabling signal in the fuse enabling unit 110_1B.

Continuously, referring to operation of the repair circuit controller 600, if at least one of the repair signals HITZ<0: 31> output from each of the repair address comparison unit 100_1 to 100_N is input at logical low, the first or the second repair sense node HIT_SUM_UP or HIT_SUM_DOWN is activated at logical high. Thus, the redundancy circuit enabling signal RED_ENABLE is activated at logical high and the normal circuit enabling signal NORMAL_ENABLE is inactivated at logical low.

If the redundancy circuit enabling signal RED_ENABLE is activated at logical high, the latched address RAS<2:M−1> is the repair address. So, the data access process takes place in the redundancy circuit having the spare cell unit which is used for substituting the error cell unit of the normal circuit.

FIG. 24 describes the data access process in detail. Namely, FIG. 24 is a waveform showing operation of the memory device shown in FIG. 12.

Meanwhile, if all repair signals HITZ<0:31> output from each repair address comparator 100_1 to 100_N are input at logical high, the first and the second sense node HIT_SUM_UP and HIT_SUM_DOWN is inactivated at logical low.

Thus, the redundancy circuit enabling signal RED_ENABLE is inactivated at logical low. Also, the normal circuit enabling signal NORMAL_ENABLE is activated at logical high after the signal AED_TRAC output from the repair signal path replica 650 is activated at logical low. Then, the redundancy circuit enabling signal RED_ENABLE is inactivated at logical low, and the normal enabling signal NORMAL_ENABLE is activated at logical high.

Referring to FIG. 23, outputting the signal AED_TRAC output from the repair signal path replica 650 and changing value of the repair sense nodes HIT_SUM_UP and HIT_SUM_DOWN takes place at the same point of time, because the repair signal path replica 650 copies the delayed value of the repair signal, e.g., HITZ<0>, which passes through the repair signal combination unit, e.g., 610 or 650.

In addition, if the redundancy circuit enabling signal RED_ENABLE is disabled at logical low and the normal circuit enabling signal NORMAL_ENABLE is enabled at logical high, the latched address RAZ<2:M−1> is not the repair address. So, the data access process takes place in the normal circuit having the normal cell unit.

Thus, the repair address comparators 100_1 to 100_N of the present invention output the delayed enabling signal AED_FUSE to the repair circuit controller 600 in response to the enabling signal RAE_FUSE which is output from the bank controller 500.

In addition, the delayed enabling signal AED_FUSE output from the repair address comparison replica 700 which delays the enabling signal RAE_FUSE output from the bank controller 500 for a predetermined time is always output to the repair circuit controller 600 at regular time margin of outputting the repair signal, e.g., HITZ<0>.

In the repair circuit controller 600, the normal circuit enabling signal NORMAL_ENABLE is activated by changing voltage levels of the first and the second sense nodes HIT_SUM_UP and HIT_SUM_DOWN in response to the plurality of input repair signal HITZ<0:31>. Also, corresponding with delaying the delayed enabling signal AED_FUSE by the repair signal path replica 650, the repair circuit controller 600 outputs the normal circuit enabling signal NORMAL_ENABLE, so the time margin between activating the delayed enabling signal AED_FUSE and the normal circuit enabling signal NORMAL_ENABLE maintained.

Thus, in the semiconductor memory device of the present invention, the redundancy circuit or the normal circuit is always accessed stably because each signal output from each unit of the repair circuit is always output at constantly stable time.

In addition, in the present invention, the repair address comparators 100_1 to 100_N respectively receives the latched address RAZ<2:M−1> in response to the enabling signal RAE_FUSE. So, before the bank controller 500 enables the enabling signal RAE_FUSE, the activated repair signals HITZ<0:N−1> cannot be input to the repair circuit controller 600. As a result, operation speed of the repair circuit is faster because there is a reduced time margin of comparison operations in the repair address comparators 100_1 to 100_N.

In the semiconductor memory device of the present invention, the reliability of operation becomes higher because the timing margin of operating the redundancy circuit or the normal circuit is constantly kept, after the repair circuit included in the semiconductor memory device determines whether the input address of the memory device is the repair address or not.

In addition, there is reduced the necessary time margin of comparing the input address with the repaired address, so operation speed of the repair circuit is increased. As a result, operation speed of the semiconductor memory device is totally improved.

While the present invention has been described with respect to the particular embodiments, it will be apparent to those skilled in the art that various changes and modifications may be made without departing from the spirit and scope of the invention as defined in the following claims.

What is claimed is:

1. A semiconductor device for comparing an input address with a stored repair address, comprising:
    a signal controller for generating control signals and an enable signal;
    an address latch unit in response to the control signals for latching the input address;
    N number of M-bit address comparators, each for comparing the latched input address with the stored repair address in response to a fuse reset signal and the enable signal;
    a comparator modeling block for modeling a replica time for a predetermined time corresponding to address comparing times of the address comparators to delay the enable signal for the replica time; and
    a repair circuit controller in response to the delayed enable signal output from the comparator modeling block for generating one of a repair address enable signal and a normal address enable signal based on a comparison result of the address comparators.

2. The semiconductor device as recited in claim 1, further comprising a comparator initialization unit for generating the fuse reset signal to enable and initialize the N number of M-bit address comparators.

3. The semiconductor device as recited in claim 2, wherein each of the M-bit address comparators includes:
    a fuse enabling means for receiving the fuse reset signal and the enable signal to thereby output a fuse enable signal in response to whether an enabling fuse included in the fuse enabling means is blown out or not;

a plurality of unit repair address comparing means for respectively comparing each bit of the latched input address with each bit of the stored repair address which is stored in the repair address comparing means; and a signal combination means for outputting a repair signal in response to results of the plurality of unit repair address comparing means, wherein the signal combination means is enabled by the fuse enabling signal.

4. The semiconductor device as recited in claim 3, the fuse enabling means includes:

a first MOS transistor connected to a supply voltage, gates of the first MOS transistor being supplied with a fuse reset signal;

a second MOS transistor connected to a ground voltage, gates of the second MOS transistor being supplied with the fuse reset signal;

an enabling fuse coupled between the first and second MOS transistors;

a first inverter for receiving a signal supplied between the enable fuse and the second MOS transistor;

a third MOS transistor connected between an input terminal of the first inverter and the ground voltage, gate of the third MOS transistor being coupled to an output terminal of the first inverter;

a second inverter for receiving an output signal from the first inverter;

a first transmission gate for outputting the enabling signal as the fuse enabling signal by turning on when the enable fuse is blown out; and a second transmission gate for outputting the supplied signal between the enable fuse and the second MOS transistor as the fuse enabling signal by turning on when the enable fuse is not blown out, wherein the first and the second transmission gates are controlled by output signals from the first and the second inverters.

5. The semiconductor device as recited in claim 4, the fuse enabling means further includes a delay means for delaying the enabling signal for a predetermined time.

6. The semiconductor device as recited in claim 5, the unit repair address comparing means includes:

a fourth MOS transistor connected to a supply voltage, gates of the fourth MOS transistor being supplied with a fuse reset signal;

a fifth MOS transistor connected to a ground voltage, gates of the fifth MOS transistor being supplied with the fuse reset signal;

an address fuse coupled between the fourth and fifth MOS transistors;

a third inverter for receiving a signal supplied between the address fuse and the fifth MOS transistor;

a sixth MOS transistor connected between an input terminal of the third inverter and the ground voltage, gate of the sixth MOS transistor being coupled to an output terminal of the third inverter;

a fourth inverter for receiving an output signal from the first inverter;

a third transition gate for outputting one bit of the input address to the signal combination means as a comparison signal by turning on if the address fuse is blown out; and a fourth transition gate for outputting one bit of the inverse input address to the signal combination means as a comparison signal by turning on if the address fuse is not blown out.

7. The semiconductor device as recited in claim 6, the signal combination means includes:

a plurality of first NOR gates for receiving the fuse enabling signal and the comparison signal output from the plurality of unit repair address comparing means;

a plurality of first NAND gates for receiving output signals from the plurality of first NOR gates;

a second NOR gate for receiving output signals from the plurality of first NAND gates; and a fifth inverter for receiving an output signal from the second NOR gate and outputting the repair signal.

8. The semiconductor device as recited in claim 7, further comprising a repair address comparison replica which includes:

a third NOR gate for delaying the enabling signal by a delay time of the comparison signal output from the plurality of unit repair address comparing means by a delaying value of the plurality of first NOR gate;

a second NAND gate for delaying an output signal from the third NOR gate by a delay time of the plurality of first NOR gate; and a fourth NOR gate for delaying an output signal from the second NAND gate by a delay time of the second NOR gate.

9. The semiconductor device as recited in claim 8, the repair address comparison replica further includes an output controller for adjusting phase and level of an output signal from the fourth NOR gate in order to equalize phase and level of an output signal from the fourth NOR gate with phase and level of the repair signal which is delivered from the repair address comparing means to the repair circuit controller.

10. The semiconductor device as recited in claim 3, the fuse enabling means includes:

a first MOS transistor connected to a supply voltage, gates of the first MOS transistor being supplied with a fuse reset signal;

a second MOS transistor connected to a ground voltage, gates of the second MOS transistor being supplied with the fuse reset signal;

an enabling fuse coupled between the first and second MOS transistors;

a first inverter for receiving a signal supplied between the enabling fuse and the second MOS transistor;

a third MOS transistor connected between an input terminal of the first inverter and the ground voltage, gate of the third MOS transistor being coupled to an output terminal of the first inverter; and a first NAND gate for receiving the enabling signal and an output signal from the first inverter and outputting the fuse enabling signal.

11. The semiconductor device as recited in claim 10, the signal combination means includes:

a plurality of first NOR gates for receiving the fuse enabling signal and the comparison signal output from the plurality of unit repair address comparing means;

a plurality of second NAND gates for receiving output signals from the plurality of first NOR gates;

a second NOR gate for receiving output signals from the plurality of second NAND gates; and a second inverter for receiving an output signal from the second NOR gate and outputting the repair signal.

12. The semiconductor device as recited in claim 11, the repair address comparison replica includes:
  a third inverter for receiving the enabling signal;
  a third NOR gate for delaying the comparison signal output from the plurality of unit repair address comparing means by a delay value of the plurality of first NOR gates;
  a second NAND gate for delaying an output signal from the third NOR gate by a delay value of the plurality of first NOR gates; and
  a fourth NOR gate for delaying an output signal from the second NAND gate by a delay value of the second NOR gate.

13. The semiconductor device as recited in claim 12, the repair address comparison replica further includes an output controller for adjusting phase and level of an output signal from the fourth NOR gate in order to equalize phase and level of an output signal from the fourth NOR gate with phase and level of the repair signal which is delivered from the repair address comparing means to the repair circuit controller.

14. The semiconductor device as recited in claim 1, the repair circuit controller includes:
  at least one repair signal combination means for receiving the plurality of repair signals which is output from the plurality of repair address comparing means and driving level of a repair sensing node in response to result of combining the plurality of repair signals;
  a repair signal path replica for delaying the enabling signal which passes through the repair address comparison replica for a delay value until the repair signal combination means drives the level of the repair sensing node;
  a first output means for outputting a redundancy circuit enabling signal which is used for operating the redundancy circuit in response to the level of the repair sensing node; and
  a second output means for outputting a normal circuit enabling signal which is used for operating a normal circuit in response to the level of the repair sensing node after it is enabled by the enabling signal which passes through the repair signal path replica.

15. The semiconductor device as recited in claim 14, the repair signal combination means includes:
  a plurality of first NAND gates for receiving the plurality of repair signals;
  a plurality of first NOR gates for receiving output signals from the plurality of first NAND gates; and
  at least one second NAND gate for receiving output signals from the plurality of first NOR gates and driving the level of repair sensing node.

16. The semiconductor device as recited in claim 15, the repair signal path replica includes:
  a third NAND gate for delaying the enabling signal which passes through the repair address comparison replica for a delay value of the first NAND gates;
  a second NOR gate for delaying an output signal from the third NAND gate for delay value of the first NOR gate; and
  a fourth NAND gate for delaying an output signal from the second NOR gate for a delay value of the second NAND gate.

17. The semiconductor device as recited in claim 16, the repair signal path replica further includes an output controller for adjusting phase and level of an output signal from the fourth NAND gate in order to equalize phase and level of the repair sensing node.

18. The semiconductor device as recited in claim 17, the second output means includes:
  a fifth NOR gate for receiving the level of the repair sensing node and the enabling signal which is output from the repair signal path replica; and
  a buffer for buffering an output signal of the fifth NOR gate and outputting the normal circuit enabling signal.

19. A semiconductor device for comparing an input address with a stored repair address, comprising:
  a signal controller for generating control signals and an enable signal;
  an address latch unit in response to at least one of the control signals for latching the input address;
  N number of M-bit address comparators, each for comparing the latched input address with the stored repair address in response to a fuse reset signal and the enable signal;
  a comparator modeling block for modeling a replica time for a predetermined time corresponding to address comparing times of the address comparators to delay the enable signal for the replica time;
  a repair circuit controller in response to the delayed enable signal output from the comparator modeling block for generating one of a repair address enable signal and a normal address enable signal based on a comparison result of the address comparators; and
  a comparator initialization unit for initializing the N number of M-bit address comparators.

20. The semiconductor device as recited in claim 19, wherein the comparator initialization unit generates the fuse reset signal to enable and initialize the N number of M-bit address comparators.

21. A semiconductor device for comparing an input address with a stored repair address, comprising:
  a signal controller for generating an enable signal;
  a address comparator for comparing the input address with the stored repair address in response to the enable signal;
  a modeling block for modeling a replica time for a predetermined time corresponding to address comparing time of the address comparator to delay the enable signal forte replica time; and
  a repair circuit controller for generating one of a repair address enable signal for a redundancy circuit and a normal address enable signal for a normal circuit according to the result of the comparison in response to the delayed enable signal output from the comparator modeling block.

22. The semiconductor device as recited in claim 21, wherein the replica time is duplicated as the comparison time that the address comparator performs.

23. The semiconductor device as recited in claim 22, wherein the repair circuit controller includes:
  a repair signal combination unit for receiving the result of the comparison to generate a repair signal;
  a signal replica unit for delaying the delayed enable signal output for a modeling time corresponding to the generation time of the repair signal; and
  a signal output unit configured to enable a redundancy circuit or enable a normal circuit in response to the delayed enable signal from the signal replica unit.

24. A method for operating a semiconductor device configured to comparing an input address with a stored repair address, comprising:
  generating an enable signal;

comparing the input address with the stored repair address in response to the enable signal;

modeling a replica time for a predetermined time corresponding to address comparing time of the address comparator;

delaying the enable signal for the replica time; and generating one of a repair address enable signal for a redundancy circuit and a normal enable signal for a normal circuit according to the result of the comparison in response to the delayed enable signal output.

25. The method for operating a semiconductor device as recited in claim 24, wherein the replica time are duplicated as the comparison time that the address comparator performs.

* * * * *